US011709190B2

(12) United States Patent
Shah

(10) Patent No.: US 11,709,190 B2
(45) Date of Patent: Jul. 25, 2023

(54) RADIO FREQUENCY (RF) POWER SENSOR

(71) Applicants: QUALCOMM Incorporated, San Diego, CA (US); Henriette C Franck

(72) Inventor: Peter J. Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/515,455

(22) Filed: Oct. 30, 2021

(65) Prior Publication Data

US 2023/0132870 A1   May 4, 2023

(51) Int. Cl.
*G01R 21/06* (2006.01)
*H03K 17/687* (2006.01)

(52) U.S. Cl.
CPC ......... *G01R 21/06* (2013.01); *H03K 17/6872* (2013.01)

(58) Field of Classification Search
CPC .......................... G01R 21/06; H03K 17/6872
USPC ....................................................... 324/76.11
See application file for complete search history.

(56) References Cited

U.S. PATENT DOCUMENTS

| | | | |
|---|---|---|---|
| 7,274,206 B2* | 9/2007 | Prikhodko | H03F 1/30 324/95 |
| 2011/0025422 A1* | 2/2011 | Marra | H03F 1/30 330/296 |
| 2011/0221421 A1* | 9/2011 | Williams | H01L 24/17 324/76.11 |
| 2012/0008669 A1* | 1/2012 | Teraguchi | G01R 21/10 375/224 |

* cited by examiner

*Primary Examiner* — Jermele M Hollington
*Assistant Examiner* — Robert P Alejnikov, Jr.
(74) *Attorney, Agent, or Firm* — Polsinelli

(57) ABSTRACT

Aspects of the disclosure relate to devices, wireless communication apparatuses, methods, and circuitry for a RF power sensor. One aspect is an apparatus including a power sensor transistor configured to receive a radio frequency (RF) input signal and to generate an output indicative of a power of the RF input signal. The apparatus further includes a current source configured to generate a bias current. Also, the apparatus includes a current mirror, which is formed by the power sensor transistor and a second transistor, configured to provide the bias current to the power sensor transistor. The apparatus further includes a feedback circuit, which is coupled to the power sensor transistor and the second transistor, configured to control a drain current of the second transistor with respect to the bias current.

30 Claims, 15 Drawing Sheets

RADIO FREQUENCY (RF) POWER SENSOR

TECHNICAL FIELD

This present disclosure generally relates to radio frequency (RF) applications, and more particularly to RF power sensors.

BACKGROUND

Many of the services provided by electronic devices in the current interconnected world depend at least partly on electronic communications. Electronic communications can include those exchanged between or among distributed electronic devices using wireless or wired signals that are transmitted over one or more networks, such as the Internet or a cellular network. Wireless communication systems are widely deployed to provide various telecommunication services such as telephony, video, data, messaging, and broadcasts.

Electronic devices are expected to be able to sense RF signal power to optimize circuit operation for these wireless communications. However, these electronic devices are expected to meet various requirements, such as having good power supply rejection, high sensitivity, and a large dynamic range. Consequently, electrical engineers and other designers of these electronic devices strive to enable these electronic devices to effectively and accurately detect RF signal power, while still meeting these various requirements.

SUMMARY

Disclosed are systems, apparatuses, methods, and computer-readable media for electronic communications and, more specifically, to devices, wireless communication apparatuses, and circuitry implementing an RF power sensor (also referred to as an RF power detector) for improved power supply rejection, sensitivity, and dynamic range.

In one or more examples, an RF power sensor is provided. The power sensor includes a power sensor transistor configured to receive a RF input signal and to generate an output indicative of a power of the RF input signal. The apparatus further includes a current source configured to generate a bias current. Also, the apparatus includes a current mirror, which is formed by the power sensor transistor and a second (mirrored) transistor, configured to provide the bias current to the power sensor transistor. The apparatus further includes a feedback circuit, which is coupled to the power sensor transistor and the second transistor, configured to control a drain current of the second transistor with respect to the bias current.

In one or more examples, the power sensor transistor and the second transistor are both p-channel metal-oxide semiconductor (PMOS) transistors. In other examples, the power sensor transistor and the second transistor are both n-channel metal-oxide semiconductor (NMOS) transistors.

In some examples, the feedback circuit is further configured to control the drain current of the second transistor such that the drain current is equal to the bias current. In at least one example, the feedback circuit includes a variable current source configured to generate a control current, which controls the drain current of the second transistor. In one or more examples, the variable current source is coupled to the power sensor transistor and the second transistor. In at least one example, the feedback circuit further includes a control circuit configured to control the variable current source. In some examples, the control circuit is coupled to the variable current source and to the second transistor.

In at least one example, the second transistor is coupled to the current source. In some examples, a gate of the second transistor and a gate of the power sensor transistor are coupled to each other via a bias resistor. In one or more examples, a bias voltage is applied to a gate of the second transistor. In at least one example, an input capacitor is coupled to a gate of the power sensor transistor.

In one or more examples, the power sensor transistor is coupled to a load. In one or more examples, the load may be a load circuit, such as a load resistor, a transimpedance amplifier, or a current mirror. In some examples, the load is coupled to a reference voltage, when the power sensor transistor and the second transistor are both NMOS transistors. In other examples, the load is coupled to ground, when the power sensor transistor and the second transistor are both PMOS transistors.

In some examples, the power sensor further includes a load slope control circuit, which is coupled in parallel with the load. The load slope control circuit is configured to extend a dynamic range of the power sensor by producing a dynamic resistance when a voltage across the load is above a threshold voltage. In one or more examples, the load slope control circuit includes a first load slope control transistor and a second load slope control transistor, where a gate of the first load slope control transistor is coupled to a gate of the second load slope control transistor. In at least one example, the load slope control circuit further includes a slope resistor coupled to a source of the first load slope control transistor. In one or more examples, the load slope control circuit further includes a slope current source coupled to a drain of the first load slope control transistor, a gate of the first load slope control transistor, and a gate of the second load slope control transistor.

In one or more examples, the power sensor further includes an RF loop configured to contain, within the RF loop, harmonic frequency nonlinear currents of the RF input signal. In some examples, the RF loop includes the power sensor transistor and two capacitors. In one or more examples, a first of the two capacitors is coupled to a source of the power sensor transistor, a second of the two capacitors is coupled to a drain of the power sensor transistor, and both of the two capacitors are coupled to ground.

In one or more examples, the power sensor further includes a time constant control circuit, which is coupled to the power sensor transistor, configured to operate as an output filter for the power sensor. In at least one example, the time constant control circuit includes at least one time constant capacitor and at least one time constant resistor.

In some examples, a bias current source or a scaled replica of a load resistor is employed for the current source. In one or more examples, when the scaled replica of the load resistor is employed for the current source, a reference voltage is taken from above the scaled replica of the load resistor. In at least one example, when there is no RF input signal power, a difference between an output voltage of the power sensor and the reference voltage is equal to zero (0).

In one or more examples, a power sensor includes a power sensor transistor configured to receive a RF input signal and to generate an output indicative of a power of the RF input signal. The power sensor further includes a load coupled to the power sensor transistor. Also, the power sensor includes a second transistor, where a gate of the second transistor and a gate of the power sensor transistor are coupled to each other via a bias resistor, and where a source of the power sensor transistor is coupled to a source of the second transistor. In addition, the power sensor includes a first capacitor coupled between the source of the power sensor transistor and ground. Also, the power sensor includes a second capacitor coupled between a drain of the power sensor transistor and the ground. Further, the power sensor includes a feedback circuit coupled to the source of the power sensor transistor and the source of the second transistor, where the feedback circuit is configured to control a drain current of the second transistor with respect to the bias current.

In some examples, the feedback circuit includes a control circuit and a variable current source, where the control circuit is coupled to a drain of the second transistor and the variable current source, and where the variable current source is coupled to the source of the power sensor transistor and the source of the second transistor.

In one or more examples, a method for sensing power includes receiving, by a power sensor transistor, an RF input signal. The method further includes generating, by a current source, a bias current. In addition, the method includes providing, by a current mirror formed by the power sensor transistor and a second transistor, the bias current to the power sensor transistor. Additionally, the method includes controlling, by a feedback circuit coupled to the power sensor transistor and the second transistor, a drain current of the second transistor with respect to the bias current. Further, the method includes generating, by the power sensor transistor, an output indicative of the RF input signal.

In some aspects, the apparatuses described above can be employed within a mobile device. In some aspects, additional wireless communication circuitry is present. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF DRAWINGS

Illustrative embodiments of the present application are described in detail below with reference to the following drawing figures.

DETAILED DESCRIPTION

Figure 1:
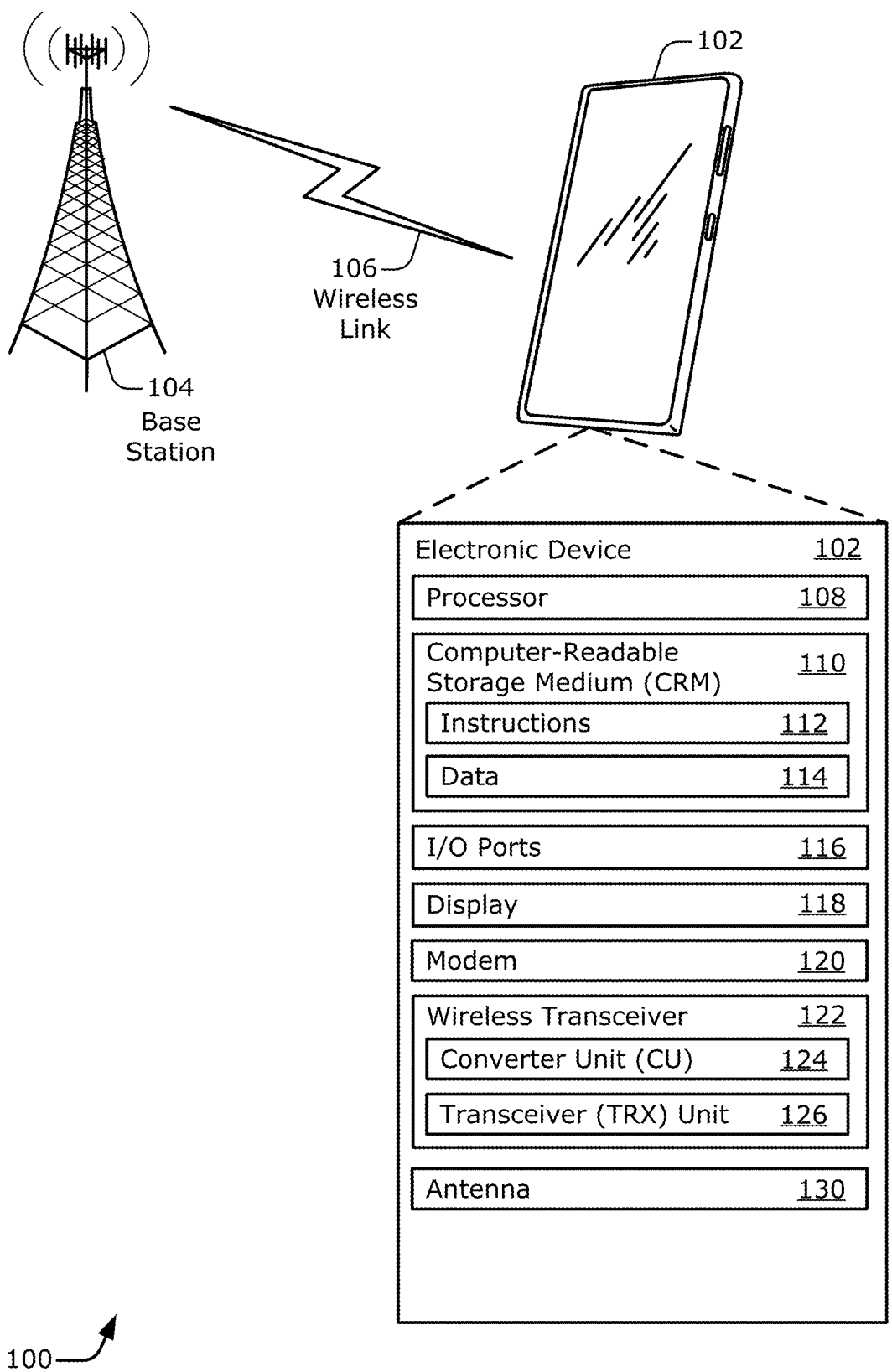
FIG. 1 is a diagram illustrating an exemplary environment that includes an electronic device and a base station, each comprising a transceiver or receiver having a receive path that can include an implementation of an RF power sensor, in accordance with examples described herein.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

Existing power sensor designs can have disadvantages such as a limited dynamic range, limited to no power supply rejection, and contamination of the power supply and/or ground by nonlinear power supply currents. For example, many existing power sensor designs have a very limited dynamic range (e.g., a small range, such as approximately ten (10) decibels (dB)). The limited dynamic range means that when the power of the input signal is too low, the signal will be below the noise of the power sensor and the power sensor will not be able to accurately measure the power of the signal. When the power of the input signal is too high, the power sensor will saturate and will not be able to accurately measure the power of the signal. The dynamic range can be dependent upon frequency and, therefore, at higher frequencies (e.g., millimeter-wave (mm-wave) frequencies), the dynamic range may be more important for design performance. In order to obtain accurate measurements using these existing power sensor designs, often the range of the power sensor needs to be manually set multiple times at different range settings until an appropriate range setting is determined. As such, it can be an iterative process to obtain a proper range setting that provides an accurate power measurement. The iterative range setting process can be very time consuming and can require keeping the circuits powered for some time, which involves extra power consumption.

Little to no power supply rejection in a power sensor can lead to inaccurate power sensor measurements. In power sensor designs with limited to no power supply rejection, any noise or ripple on the power supply can be introduced into the power sensor. The power sensor measurements in such a design will be inaccurate because the noise and/or ripple will be included with the input power in the measurement.

An additional disadvantage of some power sensors involves the contamination of the supply and/or ground by nonlinear power sensor currents. Power sensors operate on a nonlinear principle, meaning that the power sensors create a very strong even-order nonlinearity that will capture the input power of the signal. If the nonlinear currents generated by the power sensor get introduced into the power supply and/or ground, the nonlinear currents can migrate to and contaminate other sensitive circuits.

Aspects of the disclosure are related to RF power sensors that have improved designs. The RF power sensors described herein can overcome the disadvantages of the existing power supply designs, such as those described above, by providing good power supply rejection, high sensitivity, and a large dynamic range. The RF power sensor designs according to aspects described herein will be described in detail with respect to the figures below. It should be noted that the disclosed RF power sensors can be employed for many applications such as, but not limited to, operating as a jamming detector, ensuring the accuracy of transmission power, and calibration of gain in a receive chain.

FIG. 1 is a diagram illustrating an exemplary environment 100 that includes an electronic device 102 and a base station 104, each comprising a transceiver (e.g., wireless transceiver 122 of the electronic device 102) or a receiver having a receive path that can include an implementation of an RF power sensor, in accordance with examples described herein. In the environment 100, the electronic device 102 communicates with a base station 104 through a wireless communication link 106 (wireless link 106). In such an example, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 102 may communicate with the base station 104 or another device via a wired connection, a wireless connection, or a combination thereof The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 can be realized as a screen or projection that presents graphics (e.g., one or more graphical images), of the electronic device 102, such as for a user interface associated with an operating system, program, or application. Alternatively, or additionally, the display 118 may be implemented as a display port or virtual interface through which graphical content of the electronic device 102 is communicated or presented.

For communication purposes, the electronic device 102 also includes a modem 120, a wireless transceiver 122, and at least one an antenna 130. The wireless transceiver 122 includes a converter unit (CU) 124 and a transceiver (TRX) unit 126. The wireless transceiver 122 provides connectivity to respective networks and other electronic devices connected therewith using RF wireless signals. Additionally, or alternatively, the electronic device 102 may include a wired transceiver, such as an Ethernet or fiber optic interface for communicating over a personal or local network, an intranet, or the Internet. The wireless transceiver 122 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 100, the wireless transceiver 122 enables the electronic device 102 to communicate with the base station 104 and networks connected therewith. Other figures referenced herein may pertain to other wireless networks.

The modem 120, such as a baseband modem, may be implemented as a system on-chip (SoC) that provides a digital communication interface for data, voice, messaging, and other applications of the electronic device 102. The modem 120 may also include baseband circuitry to perform high-rate sampling processes that can include analog-to-digital conversion (ADC), digital-to-analog conversion (DAC), gain correction, skew correction, frequency translation, and so forth. The modem 120 may also include logic to perform in-phase/quadrature (I/Q) operations, such as synthesis, encoding, modulation, demodulation, and decoding. More generally, the modem 120 may be realized as a digital signal processor (DSP) or a processor that is configured to perform signal processing to support communications via one or more networks. Alternatively, ADC or DAC operations may be performed by a separate component or another illustrated component, such as the wireless transceiver 122.

The wireless transceiver 122 can include circuitry, logic, and other hardware for transmitting or receiving a wireless signal for at least one communication frequency band. In operation, the wireless transceiver 122 can implement at least one radio-frequency transceiver unit to process data and/or signals associated with communicating data of the electronic device 102 via the antenna 130. Generally, the wireless transceiver 122 can include filters, switches, amplifiers, and so forth for routing and processing signals that are transmitted or received via the antenna 130. Generally, the wireless transceiver 122 includes multiple transceiver units (e.g., for different wireless protocols such as WLAN versus WWAN or for supporting different frequency bands or frequency band combinations).

The filters, switches, amplifiers, mixers, and so forth of wireless transceiver 122 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 130. Thus, the single-ended amplifier can couple a wireless signal to or from the antenna 130 in addition to increasing a strength of the signal. In some implementations, the switch circuitry can switchably couple individual transformers a set of transformers to the single-ended amplifier. The set of transformers provides a physical or electrical separation between the single-ended amplifier and other circuitry of the wireless transceiver 122. The set of transformers also conditions a signal propagating through the set of transformers. Outputs of a transformer can be coupled to one or more mixers.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 122 may also include logic (not shown) to perform in-phase/quadrature (I/Q) operations, such as synthesis, encoding, modulation, demodulation, and decoding using a synthesized signal.

In some cases, components of the wireless transceiver 122, or a transceiver unit 126 thereof, are implemented as separate receiver and transmitter entities. Additionally or alternatively, the wireless transceiver 122 can be realized using multiple or different sections to implement respective receiving and transmitting operations (e.g., using separate transmit and receive chains). Example implementations of a transceiver unit 126 are described below with reference to FIG. 2. In addition, different wireless protocols such as WWAN and WLAN may be implemented on separate chips or as separate System-on-a-Chips (SoCs). As such, the blocks such as the modem 120 and transceiver 122 may represent more than one modem 120 or transceiver implemented either together on separate chips or separate SoCs.

The wireless transceiver 122 of the electronic device 102 can also include an automatic gain control (AGC) unit (e.g., the wireless transceiver unit 126 of the wireless transceiver 122 may comprise the AGC unit). When the wireless transceiver 122 of the electronic device 102 receives a signal from a transmitter (e.g., a transceiver or transmitter of the base station 104), depending upon how far the transmitter is located from the electronic device 102, the strength of the received signal will vary. The AGC unit can add gain to a received signal to amplify the signal level to at least a threshold signal level that is required by the analog-to-digital converter(s) of the modem 120 and by subsequent processing. The amount of gain needed to amplify the received signal is dependent upon the strength (power level) of the received signal.

The wireless transceiver 122 can also include an RF power sensor (e.g., the wireless transceiver unit 126 of the wireless transceiver 122 may comprise the RF power sensor). The RF power sensor can measure the power level of the received signal. The RF power sensor can provide the power level measurement of the received signal to the AGC unit. The AGC unit can then use the power level measurement information to accurately correct the gain for the received signal. Similarly, the transceiver or receiver of the base station 104 can include an AGC unit and an RF power sensor that can be used together to correct the gain of any signals received by the base station 104 for processing. Also, the RF power sensor can used to calibrate the transmit output power by being placed at the output of a power amplifier (PA) in a transmitter path.

The RF power sensor can also be used as a jammer detector in the electronic device 102. In particular, the RF power sensor can operate as a jammer detector by providing information to the AGC unit to avoid receiver saturations due to jamming signals from jammers. For example, if a jamming signal saturates the receive signal chain of the wireless transceiver 122, then the level of that jamming signal can be detected. The RF power sensor can measure the power level of the jamming signal and provide that power level measurement information to the AGC unit. The AGC unit, based on that power level measurement, can adjust the gain of the receive chain of the wireless transceiver 122 accordingly. Likewise, the RF power sensor can be used as a jammer detector in the base station 104.

The RF power sensor can also be employed by the base station 104 to ensure the accuracy of the transmission power of the electronic device 102. When a receiver (e.g., a transceiver or receiver of the base station 104) receives a signal that is transmitted from a transmitter (e.g., the wireless transceiver 122 of the electronic device 102), it is important that the power level of the received signal is at an optimum level for the receiver for processing. The RF power sensor in the base station 104 can measure the power level of the received signal at the base station 104. That power level measurement information can be provided to the electronic device 102. Based on the power level measurement, the wireless transceiver 122 of the electronic device 102 can adjust the power level of the transmitted signal to be at a particular desired power level.

In addition, the RF power sensor can be used for gain calibration of the receive chain in the wireless transceiver 122 of the electronic device 102. For the calibration of the gain of the receive chain, a signal with a known power level can be input at the input of the receive chain. The RF power sensor can then sense the gain of the signal outputted at the output of the receive chain. The gain of the receive chain can be obtained by dividing the input power at the input of the receive chain by the output power at the output of the receive chain. Then, the internal circuits of the receive chain can be calibrated accordingly to achieve a particular desired gain for the receive chain. Similarly, the RF power sensor can be used for gain calibration of the receive chain of the transceiver or receiver of the base station 104.

Figure 2:
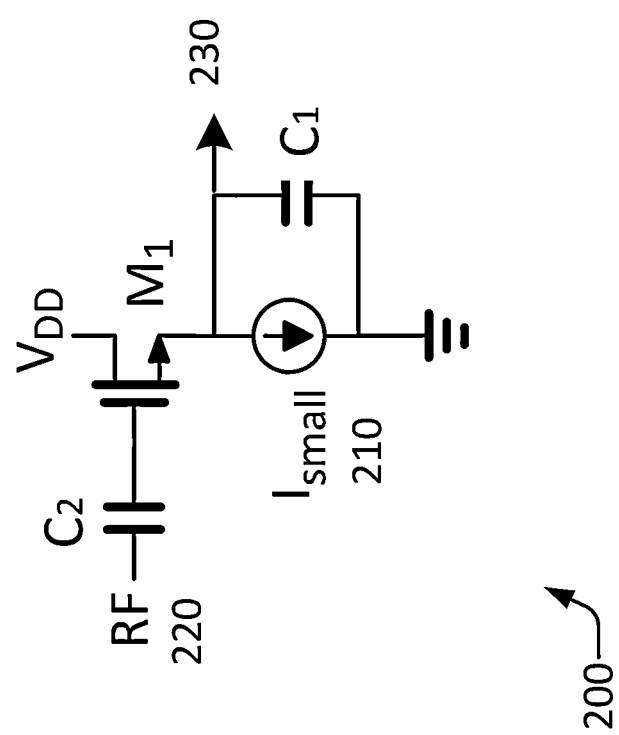
FIG. 2 is a diagram illustrating a first topology of an RF power sensor that employs an n-channel metal-oxide semiconductor (NMOS) transistor for the power sensor transistor.

FIG. 2 is a diagram illustrating a first example topology of an RF power sensor 200 that employs an n-channel metal-oxide semiconductor (NMOS) transistor for the power sensor transistor $M_1$. The design of the RF power sensor 200 is a current-starved source-follower design. For the RF power sensor 200, an RF input 220 is coupled to the power sensor transistor $M_1$ via an input capacitor $C_2$. The power sensor transistor $M_1$ is coupled to a power supply $V_{DD}$ and connected (coupled) to a current source 210, which is coupled in parallel to a load capacitor $C_1$. Coupled used herein may refer to be electrically coupled or to a connection between elements or objects. Coupled may further refer to direct or indirect coupling between two circuit elements (e.g., in some examples intervening elements may be possible as would be understood by one of skill in the art).

During operation of the RF power sensor 200, the current source 210 generates a small current $I_{small}$, which is just enough current to power the transistor $M_1$ "on", and an RF input signal is input into the RF input 220 of the power sensor 200. When the RF input signal swings negative, the power sensor transistor $M_1$ cuts off such that the power sensor transistor $M_1$ does not conduct. When the RF input signal swings positive, the power sensor transistor $M_1$ has an increased gate-source voltage ($V_{GS}$), and more current will be flowing through the power sensor transistor $M_1$ (e.g., more current will be flowing from the drain to the source of the power transistor $M_1$), which flows into the load capacitor $C_1$. As such, the higher the amplitude of the RF input signal, the higher the voltage will be outputted at the output 230 of the RF power sensor 200 for the power detection. Thus, the RF power sensor 200 operates like a rectifier because the RF power sensor 200 is "on" during half of the period, and is "off" during the other half of the period.

The design of the RF power sensor 200 has advantages. One advantage is that the RF power sensor 200 provides a large range versus power. Another advantage is that the RF power sensor 200 provides good power supply rejection because the drain of the power sensor transistor $M_1$ is coupled to the power supply $V_{DD}$, which allows for any swing in the power supply to not translate into the current flowing in the power supply transistor $M_1$ (e.g., the current flowing from the drain to the source of the power supply transistor $M_1$).

However, the design of the power sensor 200 has some disadvantages. One disadvantage is that the power sensor 200 has very little to no sensitivity. For example, when the input power of the RF input signal is changed (e.g., changed by 1 dB), it is desirable to have a change on the output 230 of somewhere in the range, for example, of several millivolts (mV) such that the change of input power can be accurately detected. However, for the power sensor 200, for low input power levels, when the input power of the RF input signal is changed (e.g., changed by 1 dB), the output 230 may have a small change on the order of, for example, several microvolts (μV)), which is difficult to detect because this change can be below the noise and offset of subsequent circuits that follow the output 230. As such, for this power sensor 200 design, the subsequent circuits may need to have very low noise because, for example, a subsequent analog-to-digital converter will simply take the change in voltage and convert the noise, thus adding noise to the system. However, note that, for this power sensor 200 design, for higher input power levels, when the input power of the RF input signal is changed, the output 230 will have a change of many mV. It is desirable to have a power sensor design that has good measurement accuracy across a wide range of input power levels.

Another disadvantage is that the power sensor 200 acts as an aggressor because the design allows for large nonlinear RF currents to be injected into the power supply $V_{DD}$. For example, during operation of the power sensor 200, the power sensor transistor $M_1$ conducts current during the positive half cycle of the RF input signal, and the power sensor transistor cuts off during the negative half cycle of the RF input signal. As such, the current in the power sensor transistor $M_1$ (e.g., the current flowing from the drain to the source of the power sensor transistor $M_1$) is a rectified version of the RF input signal and, as such, it is highly nonlinear. This nonlinear current may flow to the power supply $V_{DD}$ and, then, flow to other circuits that share the same power supply $V_{DD}$. This will cause nonlinear signals in the other circuits. These nonlinear signals may potentially contaminate other signals, which are also within the other circuits, that occur at frequencies where these nonlinearities are generated.

Figure 3:
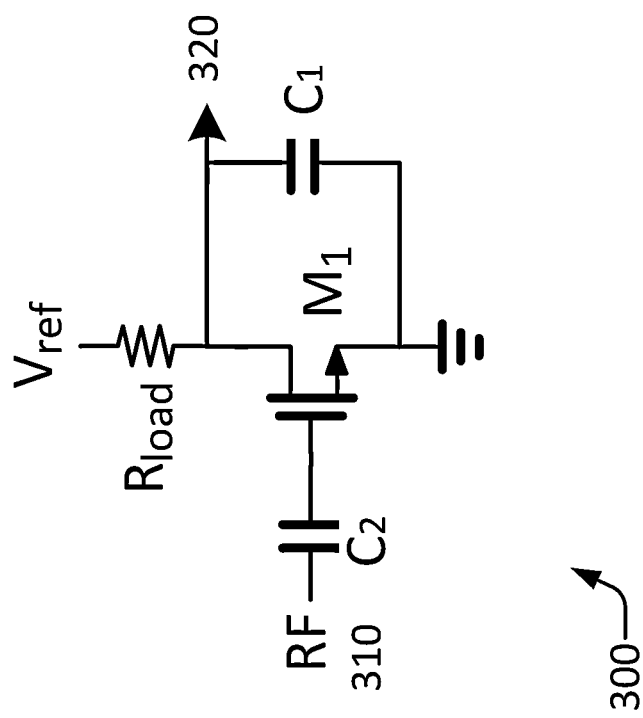
FIG. 3 is a diagram illustrating a second topology of an RF power sensor that employs an NMOS transistor for the power sensor transistor.

FIG. 3 is a diagram illustrating an example of a second topology of an RF power sensor 300 that employs an NMOS transistor for the power sensor transistor $M_1$. The design of the RF power sensor 300 is a grounded-source device design. For the RF power sensor 300, an RF input 310 is coupled to the power sensor transistor $M_1$ via an input capacitor $C_2$. The power sensor transistor $M_1$ is coupled to a reference voltage $V_{ref}$ via a load resistor $R_{load}$, and is coupled in parallel to a load capacitor $C_1$.

During operation of the RF power sensor 300, an RF input signal is input into the RF input 310 of the power sensor 300. When the RF input signal swings positive, the power sensor transistor $M_1$ is powered "on". When the RF input signal swings negative, the power sensor transistor $M_1$ cuts off such that the power sensor transistor $M_1$ does not conduct. As such, the current in the drain of the power sensor transistor $M_1$ (e.g., the current from the drain to the source of the power transistor $M_1$) is a rectified version of the RF input signal and, therefore, has a low frequency component that can be detected. That current produces a voltage across the load resistor $R_{load}$, and that voltage can be measured at the output 320 of the RF power sensor 300 for power detection.

The design of the RF power sensor 300 has the advantage that the circuit has inherent gain, which allows for higher sensitivity. With inherent gain, when the load resistor $R_{load}$ of the RF power sensor 300 is a large value, even a small change in the RF input signal will cause a significant change in the output voltage on the output 320. As such, the noise and offset of subsequent circuits (e.g., an analog-to-digital converter(s)) to the output 320 are not critical.

However, the design of the RF power sensor 300 has multiple disadvantages. One disadvantage is that the RF power sensor 300 has limited range. At a low RF input signal power, a large value for the load resistor $R_{load}$ is desired such that even a small change in the current in the power sensor transistor $M_1$ (e.g., the current from the drain to the source of the power sensor transistor $M_1$) produces a large change in the output voltage on the output 320. However, if the RF input signal power is large, a large current through the power sensor transistor $M_1$ (e.g., the current from the drain to the source of the power sensor transistor $M_1$) will be produced, which will lead to an excessive voltage swing across the load resistor $R_{load}$. The excessive swing in voltage across the load resistor $R_{load}$ will cause the power sensor transistor $M_1$ to operate in the triode (linear) region where the power sensor transistor will run out of head room and saturate.

The limited range issue of the RF power sensor 300 design may result in a need for a device to select a load resistor $R_{load}$ value that is appropriate for that RF input signal power level. If the RF input signal power level is not known, often the load resistor $R_{load}$ will need to be switched out with multiple different values until the appropriate load resistor $R_{load}$ value is determined. This iterative process can be very time consuming.

Another disadvantage is that the RF power sensor 300 has effectively no power supply rejection. As such, any ripple or noise on the reference voltage $V_{ref}$ will be present at the output 320 of the RF power sensor 300.

Figure 4:
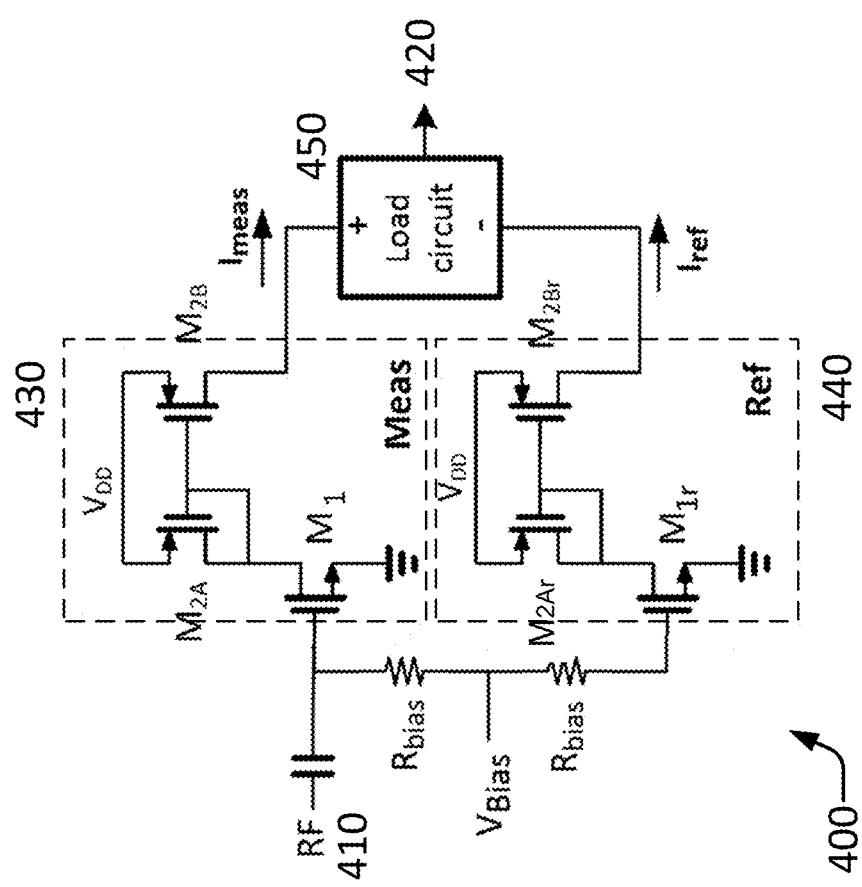
FIG. 4 is a diagram illustrating a third topology of an RF power sensor that employs an NMOS transistor for the power sensor transistor.

FIG. 4 is a diagram illustrating an example of a third topology of an RF power sensor 400 that employs an NMOS transistor for the power sensor transistor $M_1$. The RF power sensor 400, comprises two branches, which are a measurement (Meas) branch 430 and a reference (Ref) branch 440. The measurement branch 430 and the reference branch 440 are identical, except that the measurement branch 430 receives RF input signal power from the RF input 410, and the reference branch 440 does not receive any RF input signal power. Each of the measurement branch 430 and the reference branch 440 comprises a current mirror. The current mirror of the measurement branch 430 is formed from transistor $M_{2A}$ and transistor $M_{2B}$. The current mirror of the reference branch 440 is formed from transistor $M_{2Ar}$ and transistor $M_{2Br}$.

The power sensor transistor $M_1$, which is in the measurement branch 430, operates nonlinearly and produces a current that flows through the current mirror of the measurement branch 430 to the positive side of a load circuit 450 (e.g., measurement current $I_{meas}$).

A mirrored transistor $M_{1r}$, which is in the reference branch 440, operates similarly to the power sensor transistor $M_1$ of the measurement branch 430, except that the mirrored transistor $M_{1r}$ produces a direct current (DC) current. This current flows through the current mirror of the reference branch 440 to the negative side of the load circuit 450 (e.g., reference current $I_{ref}$) and subtracts in the load circuit 450.

As such, when there is no RF input signal power, the measurement current $I_{meas}$ minus the reference current $I_{ref}$ is equal to zero. When there is an increase in the amount of RF input signal power, more current will be flowing in the power sensor transistor $M_1$ than in the mirrored transistor $M_{1r}$, and the measurement current $I_{meas}$ will be larger than the reference current $I_{ref}$ thereby resulting in a positive output at the output 420 of the RF power sensor 400.

The RF power sensor 400 has multiple advantages. A first advantage is that the RF power sensor 400 has inherent gain, which is provided by the load circuit 450. Inherent gain allows for good sensitivity and, as such, the noise and offset of subsequent circuits (e.g., an analog-to-digital converter(s)) to the output 420 are not critical.

Another advantage of the RF power sensor 400 is that the RF power sensor 400 has power supply rejection. As such, if there is a voltage swing on the power supply ($V_{DD}$), the effects of the voltage swing will be rejected by the current mirror of the measurement branch 430. The RF power sensor 400 employs a replica circuit (e.g., the reference branch 440) to create a reference that allows for any bias currents caused by a voltage swing to be subtracted out.

However, the RF power sensor 400 has multiple disadvantages. One disadvantage is that power sensor transistor $M_1$ dominates the noise. For the RF power sensor 400, an NMOS transistor is employed for the power sensor transistor $M_1$. In certain aspects, an RF power sensor may employ a PMOS transistor for the power sensor transistor $M_1$ because a PMOS transistor has much lower 1/f noise. However, this topology is not simple to implement because the source terminal of the PMOS transistor would need to be coupled to the power supply, and the current mirror would be coupled to a reference voltage (e.g., ground). If there is any noise present on the power supply, the noise will migrate to the power sensor transistor $M_1$, flow into the current mirror of the measurement branch 430, and contaminate subsequent circuits of the output 420. There is good ground rejection, but no power supply rejection, with this PMOS topology.

A second disadvantage of the RF power sensor 400 is that the current mirrors (of the measurement branch 430 and the reference branch 440) limit the dynamic range. In order to have low noise, a large gate-to-source voltage $V_{GS}$ of the transistor $M_{2A}$ of the measurement branch 430 is provided. The more current that is drawn across the transistor $M_{2A}$, the larger the $V_{GS}$ becomes, and thereby cause the power sensor transistor $M_1$ to operate in the triode region, which causes the RF power sensor 400 to saturate.

The load circuit 450 of the RF power sensor 400 also limits the dynamic range. The load circuit 450 comprises a load resistor $R_{load}$. For the load circuit 450, it is desirable to have a high load resistance $R_{load}$ to provide good sensitivity at low power levels. However, when there are high power levels, the measurement current $I_{meas}$ becomes significantly larger than the reference current $I_{ref}$. This causes too much voltage across the load resistor $R_{load}$ (within the load circuit 450), which causes the circuit to saturate.

A third disadvantage is that the RF power sensor 400 is an aggressor. As such, any nonlinear currents (which can be quite large) that flow within the power sensor transistor M1 (within the measurement branch 430) can leak into the power supply $V_{DD}$, and can add noise to other subsequent circuits.

Figure 5:
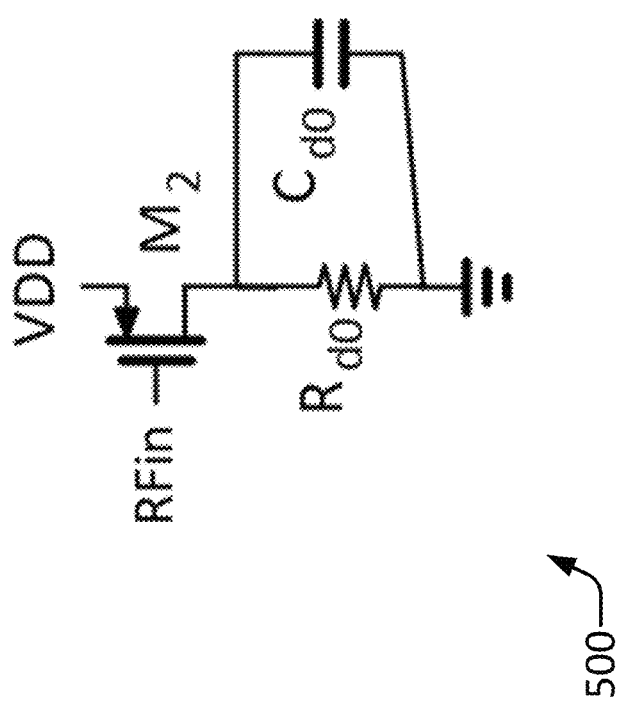
FIG. 5 is a diagram illustrating a first topology of an RF power sensor that employs a p-channel metal-oxide semiconductor (PMOS) transistor for the power sensor transistor.

FIG. 5 is a diagram illustrating a first topology of an RF power sensor 500 that employs a p-channel metal-oxide semiconductor (PMOS) transistor for the power sensor transistor $M_2$. The source of the power sensor transistor $M_2$ is coupled to a power supply $V_{DD}$, and the drain of the power sensor transistor $M_2$ is coupled to ground via a resistor $R_{do}$. The resistor $R_{do}$ is coupled in parallel with a capacitor $C_{do}$.

During operation, an RF input signal is input into the RF input $RF_{in}$ of the RF power sensor 500. The RF input signal flows into the power sensor transistor $M_2$. Employing a PMOS transistor for the power sensor transistor $M_2$ provides for lower 1/f noise than when employing an NMOS transistor, and the output of the power sensor 500 is ground referenced. However, this power sensor 500 design has the disadvantage that any noise (or RF power) on the power supply $V_{DD}$ will corrupt the power sensor measurement of the power sensor 500.

Figure 6:
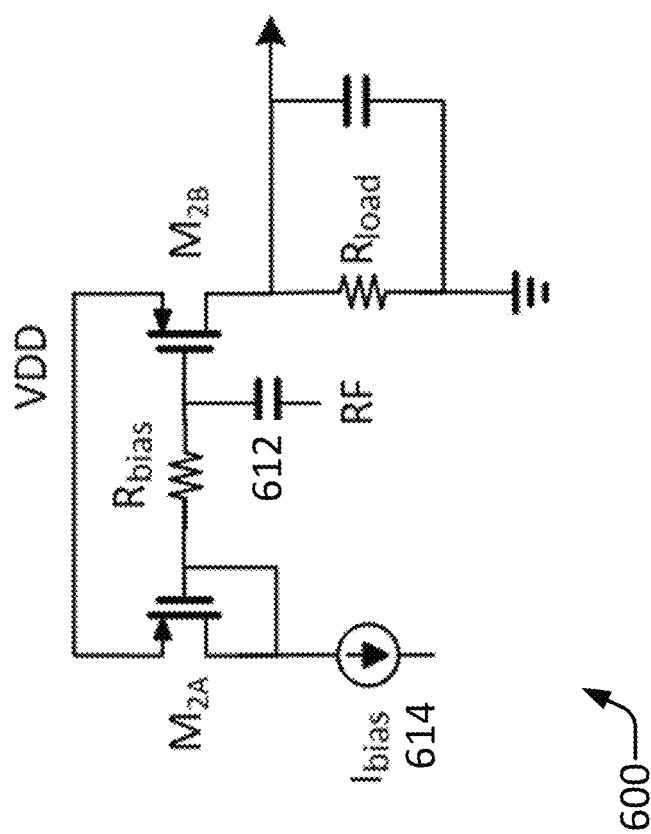
FIG. 6 is a diagram illustrating a second topology of an RF power sensor that employs a PMOS transistor for the power sensor transistor.

FIG. 6 is a diagram illustrating a second topology of an RF power sensor 600 that employs a PMOS transistor for the power sensor transistor $M_{2B}$. The power sensor 600 employs a bias network that comprises a current mirror formed by a mirrored transistor $M_{2A}$ and the power sensor transistor $M_{2B}$. A gate of the mirrored transistor $M_{2A}$ and a gate of the power sensor transistor $M_{2B}$ are coupled to each other via a bias resistor $R_{bias}$. The bias network also comprises a bias current source 614 that generates a bias current $I_{bias}$. The mirrored transistor $M_{2A}$ is coupled to the bias current source 614.

During operation, an RF input signal is input into the power sensor 600. The RF input signal flows into the power sensor transistor $M_{2B}$ via an input capacitor 612. The input capacitor 612 is coupled to the power sensor transistor $M_{2B}$. The current mirror establishes the bias current $I_{bias}$ in the power sensor transistor $M_{2B}$ at zero RF input signal power. At high RF signal input power, the current in the power sensor transistor $M_{2B}$ (e.g., the current from the drain to the source in the power sensor transistor $M_{2B}$) increases, which creates the power detection functionality. The power sensor transistor $M_{2B}$ generates an output indicative of the power of the RF input signal.

The RF power sensor 600 may be further improved by reducing ripple or noise on the power supply $V_{DD}$.

Figure 7A:
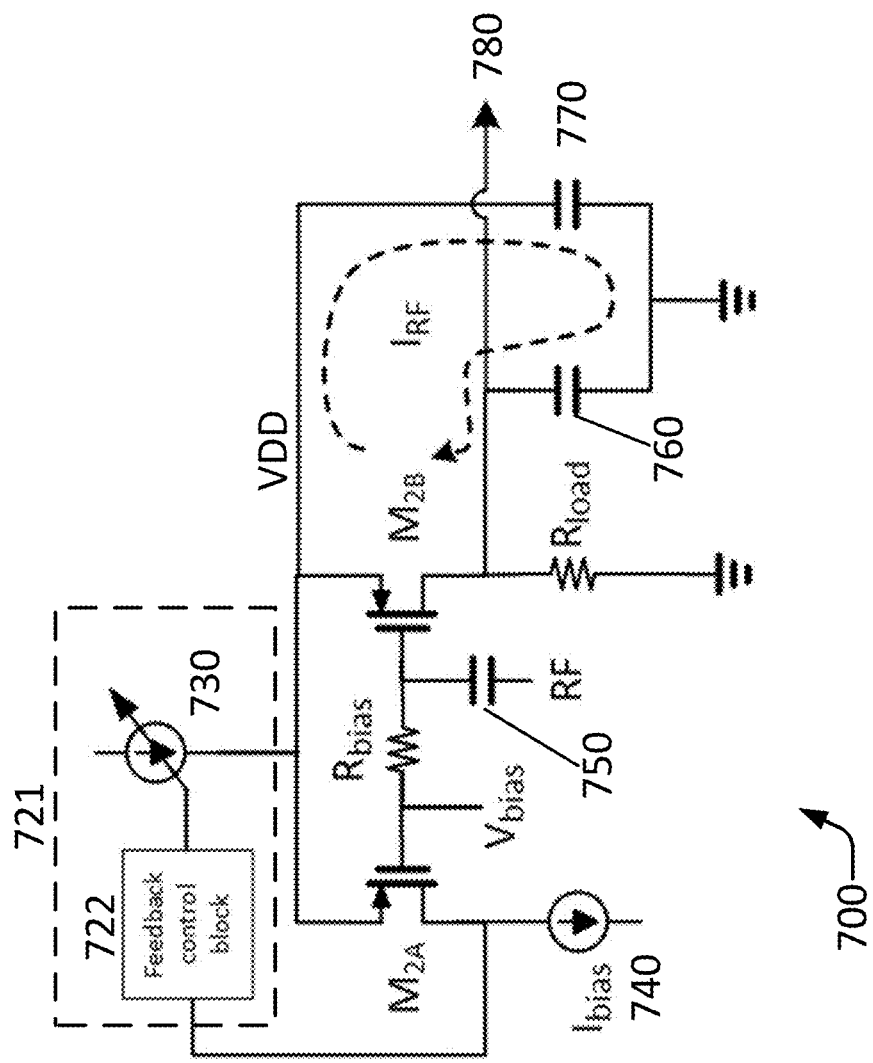
FIG. 7A is a diagram illustrating a disclosed RF power sensor that employs a PMOS transistor for the power sensor transistor and a feedback block, in accordance with examples described herein.

FIG. 7A is a diagram illustrating a disclosed RF power sensor 700 that employs a PMOS transistor for the power sensor transistor $M_{2B}$ and a feedback block 721, in accordance with examples described herein. The power sensor 700 utilizes a bias network that includes a current mirror formed by a mirrored transistor $M_{2A}$ and the power sensor transistor $M_{2B}$, where a source of the mirrored transistor $M_{2A}$ is coupled to a source of the power sensor transistor $M_{2B}$. A gate of the mirrored transistor $M_{2A}$ and a gate of the power sensor transistor $M_{2B}$ are coupled to each other via a bias resistor $R_{bias}$. A bias voltage $V_{bias}$ is coupled and applied to the gate of the mirrored transistor $M_{2A}$. The bias network also includes a bias current source 740 that generates a bias current $I_{bias}$. In one or more examples, a scaled replica of a load resistor may be employed in lieu of the bias current source 740 (e.g., refer to $R_{load}/N$ of RF power sensor 1000 of FIG. 10). The mirrored transistor $M_{2A}$ is coupled to the bias current source 740. The feedback block 721 comprises a feedback control block 722 (which comprises a control circuit) and a variable current source 730. The variable current source 730 is coupled to the source of the power sensor transistor $M_{2B}$ and the source of the mirrored transistor $M_{2A}$. The feedback control block 722 (control circuit) is coupled to the variable current source 730 and to the drain of the mirrored transistor $M_{2A}$. The RF power sensor 700 also comprises an optional RF loop that comprises two capacitors 760, 770 along with the power sensor transistor $M_{2B}$. Capacitor 770 is coupled to a source of the power sensor transistor $M_{2B}$, and capacitor 760 is coupled to a drain of the power sensor transistor $M_{2B}$. Capacitors 760 and 770 are both coupled to ground (or some reference potential). The power sensor transistor $M_{2B}$ is coupled to a load resistor $R_{load}$ (e.g., a load). The load resistor $R_{load}$ is coupled to ground. It should be noted that, in one or more examples, a load circuit may be employed for the load resistor $R_{load}$, such as a transimpedance amplifier or a current mirror.

During operation, an RF input signal is input into the RF input $RF_{in}$ of the power sensor 700. The RF input signal flows into the power sensor transistor $M_{2B}$ via an input capacitor 750. The input capacitor 750 is coupled to the power sensor transistor $M_{2B}$. A gate of the power sensor transistor $M_{2B}$ is coupled to the input capacitor 750. The current mirror (e.g., the mirrored transistor $M_{2A}$ and the power sensor transistor $M_{2B}$ together) receives and provides (establishes) the bias current $I_{bias}$ in the power sensor transistor $M_{2B}$. At high RF signal input power, the magnitude of the current in the power sensor transistor $M_{2B}$ (e.g., current from the source to the drain in the power sensor transistor $M_{2B}$) increases, thereby providing the power detection functionality. The power sensor transistor $M_{2B}$ generates an output (e.g., a voltage), which is outputted at the output 780 of the RF power sensor 700, that is indicative of the RF input signal power.

The feedback control block 722 within the feedback block 721 (which is coupled to a source of the power sensor transistor $M_{2B}$ and a source of the mirrored transistor $M_{2A}$) adjusts (controls) the variable current source 730 to generate a control current such that the drain current (Id) in the mirrored transistor $M_{2A}$ is equal to the bias current $I_{bias}$ (e.g., generate a control current to control a drain current (Id) of the mirrored transistor $M_{2A}$ with respect to the bias current $I_{bias}$). The feedback control block 722 controls the variable current source 730 to establish a desired drain voltage (Vd) for mirrored transistor $M_{2A}$, which ensures that the drain current (Id) of the mirrored transistor $M_{2A}$ is equal to the bias current $I_{bias}$. The feedback control block 722 adjusts (controls) the variable current source 730 to ensure zero (0) input current into the feedback block 721, which also ensures that the drain current (Id) of the mirrored transistor $M_{2A}$ is equal to the bias current $I_{bias}$. As the RF input signal power increases, the feedback control block 722 adjusts (controls) the variable current source 730 to absorb the current increase in the power sensor transistor $M_{2B}$.

It should be noted that, in one or more examples, a load slope control circuit (e.g., refer to load slope control 940 of FIG. 9) may be incorporated (e.g., coupled in parallel with the load resistor $R_{load}$) within the disclosed RF power sensor 700. In addition, in one or more examples, a time constant control circuit (e.g., refer to time constant control 950 of FIG. 9) may be incorporated (e.g., coupled to the power sensor transistor) within the disclosed RF power sensor 700.

The high (harmonic) frequency currents of the RF input signal pass through the capacitors 760, 770 of the RF loop. The high frequency currents will continuously rotate within a current loop $I_{RF}$ in the RF loop. The RF loop contains the high frequency currents, and prevents the high frequency currents from flowing to the power supply $V_{DD}$ or to a reference potential (e.g., ground), thereby preventing contamination of the power supply $V_{DD}$ or ground. As such, the RF loop prevents the RF power sensor 700 from being an aggressor towards other circuits that share the same power supply $V_{DD}$ and ground.

Figure 7B:
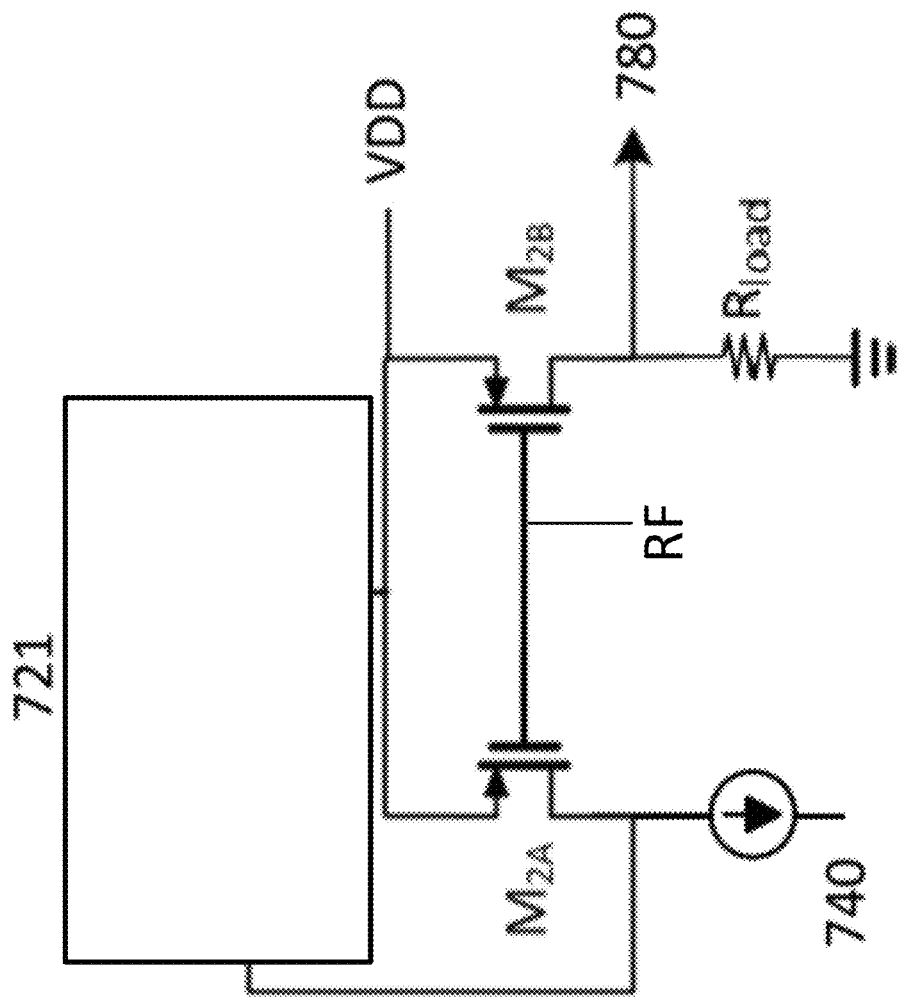
FIG. 7B is a simplified diagram illustrating a disclosed RF power sensor that employs a PMOS transistor for the power sensor transistor and a feedback block, in accordance with examples described herein.

FIG. 7B is a diagram illustrating another example of a disclosed RF power sensor 701 that employs a PMOS transistor for the power sensor transistor $M_{2B}$ and a feedback block 721, in accordance with examples described herein. In RF power sensor 701, a power sensor transistor $M_{2B}$ is configured to receive a radio frequency (RF) input signal and to generate an output (e.g., voltage) (which is outputted on the output 780) indicative of a power of the RF input signal. A current source 740 is configured to generate a bias current. In one or more examples, a scaled replica of a load resistor may be employed in lieu of the current source 740 (e.g., refer to $R_{load}/N$ of RF power sensor 1000 of FIG. 10). Also, a current mirror, which is formed by the power sensor transistor $M_{2B}$ and a mirrored (second) transistor $M_{2A}$, is configured to provide the bias current to the power sensor transistor $M_{2B}$. A load resistor $R_{load}$ (e.g., a load) is connected to a drain of the power sensor transistor $M_{2B}$. It should be noted that, in one or more examples, a load circuit may be employed for the load resistor $R_{load}$, such as a transimpedance amplifier or a current mirror. A feedback block 721, which is coupled to the power sensor transistor $M_{2B}$ and the mirrored (second) transistor $M_{2A}$, is configured to control a drain current of the mirrored (second) second transistor $M_{2A}$ with respect to the bias current. The feedback block 721 may either be implemented with a variable current source or other circuit configured to control a drain current of the second transistor with respect to the bias current.

Figure 8A:
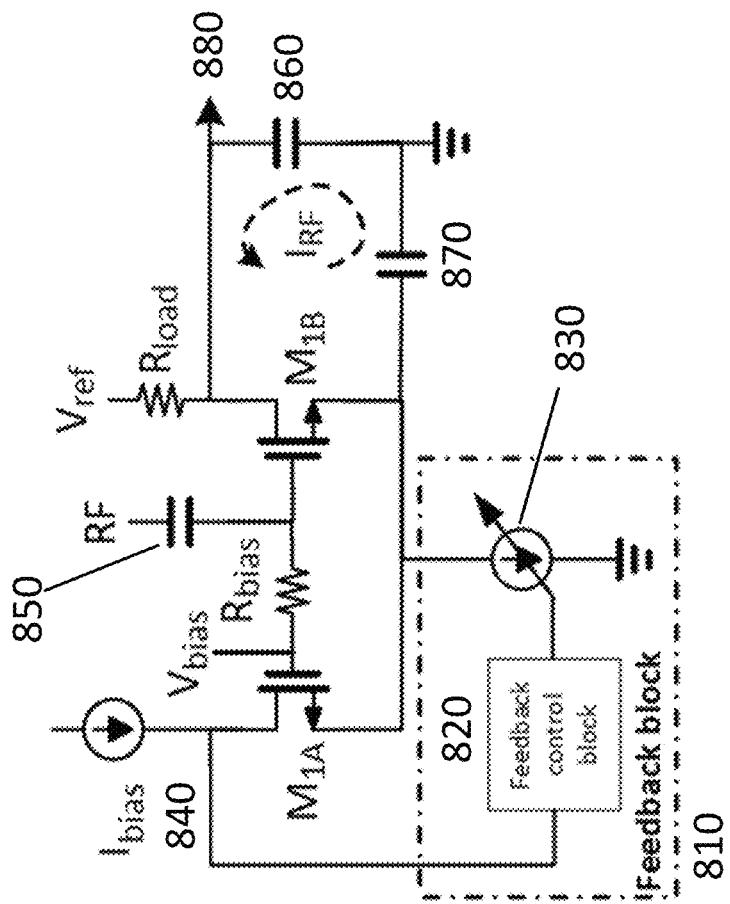
FIG. 8A is a diagram illustrating a disclosed RF power sensor that employs an NMOS transistor for the power sensor transistor and a feedback block, in accordance with examples described herein.

FIG. 8A is a diagram illustrating a disclosed RF power sensor 800 that employs an NMOS transistor for the power sensor transistor $M_{1B}$ and a feedback block 810, in accordance with examples described herein. The power sensor 800 employs a bias network that comprises a current mirror formed by a mirrored transistor $M_{1A}$ and the power sensor transistor $M_{1B}$, where a source of the mirrored transistor $M_{1A}$ is coupled to a source of the power sensor transistor $M_{1B}$. A gate of the mirrored transistor $M_{1A}$ and a gate of the power sensor transistor $M_{1B}$ are coupled to each other via a bias resistor $R_{bias}$. A bias voltage $V_{bias}$ is coupled and applied to the gate of the mirrored transistor $M_{1A}$. The bias network also comprises a bias current source 840 that generates a bias current $I_{bias}$. In one or more examples, a scaled replica of a load resistor may be employed in lieu of the bias current source 840 (e.g., refer to $R_{load}/N$ of RF power sensor 1000 of FIG. 10). The mirrored transistor $M_{1A}$ is coupled to the bias current source 840. The feedback block 810 of the RF power sensor 800 comprises a feedback control block 820, which comprises a control circuit, and a variable current source 830. The variable current source 830 is coupled to the source of the power sensor transistor $M_{1B}$ and the source of the mirrored transistor $M_{1A}$. The feedback control block 820 (control circuit) is coupled to the variable current source 830 and to the drain of the mirrored transistor $M_{1A}$. The RF power sensor 800 also optionally includes an RF loop that includes two capacitors 860, 870 along with the power sensor transistor $M_{1B}$. Capacitor 870 is coupled to a source of the power sensor transistor $M_{1B}$, and capacitor 860 is coupled to a drain of the power sensor transistor $M_{1B}$. Capacitors 860 and 870 are both coupled to ground. The power sensor transistor $M_{1B}$ is coupled to a load resistor $R_{load}$ (e.g., a load). The load resistor $R_{load}$ is coupled to a reference voltage $V_{ref}$. It should be noted that, in one or more examples, a load circuit may be employed for the load resistor $R_{load}$, such as a transimpedance amplifier or a current mirror.

During operation, an RF input signal is input into the RF input $RF_{in}$ of the power sensor 800. The RF input signal flows into the power sensor transistor $M_{1B}$ via an input capacitor 850. The input capacitor 850 is coupled to the power sensor transistor $M_{1B}$. A gate of the power sensor transistor $M_{1B}$ is coupled to the input capacitor 850. The current mirror (e.g., the mirrored transistor $M_{1A}$ and the power sensor transistor $M_{1B}$ together) receives and provides (establishes) the bias current $I_{bias}$ in the power sensor transistor $M_{1B}$. At high RF signal input power (e.g., −10 dBm to +6 dBm), the current in the power sensor transistor $M_{1B}$ (e.g., current from the drain to the source in the power sensor transistor $M_{1B}$) increases, which allows for the power detection functionality of the power sensor 800, as the power sensor transistor $M_{1B}$ generates an output (e.g., voltage), outputted at the output 880 of the RF power sensor 800, indicative of the power of the RF input signal.

The feedback control block 820 within the feedback block 810 (which is coupled to a source of the power sensor transistor $M_{1B}$ and a source of the mirrored transistor $M_{1A}$) can be used to adjust (e.g., control) the variable current source 830 within the feedback block 810 to generate a control current such that the drain current (Id) in the mirrored transistor $M_{1A}$ is equal to the bias current $I_{bias}$ (e.g., generate a control current to control a drain current (Id) of the mirrored transistor $M_{1A}$ with respect to the bias current $I_{bias}$). The feedback control block 820 controls the variable current source 830 within the feedback block 810 to establish a desired drain voltage (Vd) for mirrored transistor $M_{1A}$, thereby ensuring that the drain current (Id) of the mirrored transistor $M_{1A}$ is equal to the bias current $I_{bias}$. The feedback control block 820 can be used to adjust (e.g., control) the variable current source 830 to ensure zero input current into the feedback block 810, thereby ensuring that the drain current (Id) of the mirrored transistor $M_{1A}$ is equal to the bias current $I_{bias}$. As the RF input signal power increases, the feedback control block 820 adjusts (e.g., controls) the variable current source 830 to absorb the current increase in the power sensor transistor $M_{1B}$.

It should be noted that, in one or more examples, a load slope control circuit (e.g., refer to load slope control 940 of FIG. 9) may be incorporated (e.g., coupled in parallel with the load resistor $R_{load}$) within the disclosed RF power sensor 800. In addition, in one or more examples, a time constant control circuit (e.g., refer to time constant control 950 of FIG. 9) may be incorporated (e.g., coupled to the power sensor transistor) within the disclosed RF power sensor 800.

The high (harmonic) frequency currents of the RF input signal will pass through the capacitors 860, 870 of the RF loop. The high frequency currents will continuously rotate within a current loop $I_{RF}$ in the RF loop. As such, the RF loop contains the high frequency currents, and prevents the high frequency currents from flowing to a reference voltage Vref or to ground, thereby preventing contamination of the reference voltage Vref or ground. The operation described above to prevent contamination of the reference voltage in the RF power sensor 800 thus has the advantage of providing power supply rejection.

Figure 8B:
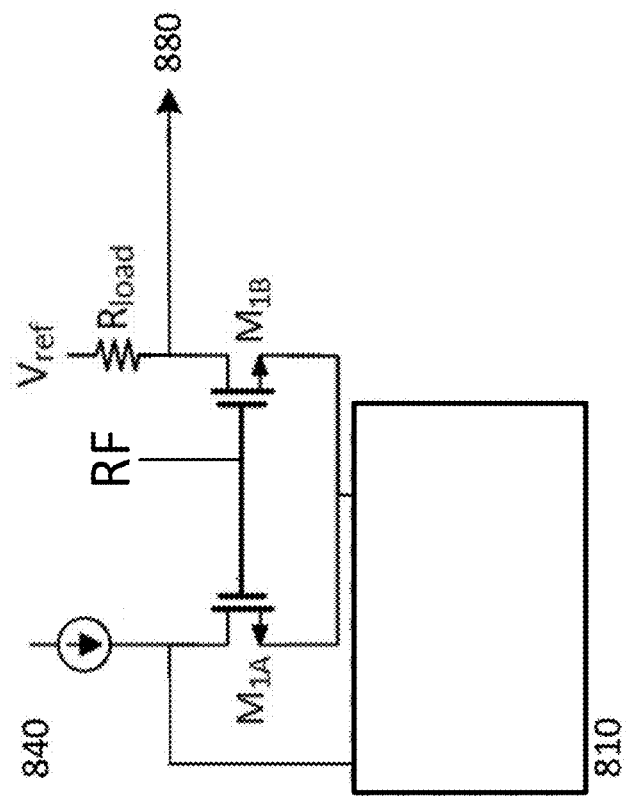
FIG. 8B is a simplified diagram illustrating a disclosed RF power sensor that employs an NMOS transistor for the power sensor transistor and a feedback block, in accordance with examples described herein.

FIG. 8B is a simplified diagram illustrating a disclosed RF power sensor 801 that employs an NMOS transistor for the power sensor transistor and a feedback block, in accordance with examples described herein. In RF power sensor 801, a power sensor transistor $M_{1B}$ is configured to receive a radio frequency (RF) input signal and to generate an output (e.g., voltage) (which is outputted on the output 880) indicative of a power of the RF input signal. A current source 840 is configured to generate a bias current. In one or more examples, a scaled replica of a load resistor may be employed in lieu of the current source 840 (e.g., refer to $R_{load}/N$ of RF power sensor 1000 of FIG. 10). Also, a current mirror, which is formed by the power sensor transistor $M_{1B}$ and a mirrored (second) transistor $M_{1A}$, is configured to provide the bias current to the power sensor transistor $M_{1B}$. A load resistor $R_{load}$ (e.g., a load) is connected to a drain of the power sensor transistor $M_{1B}$. It should be noted that, in one or more examples, a load circuit may be employed for the load resistor $R_{load}$, such as a transimpedance amplifier or a current mirror. A feedback block 810, which is coupled to the power sensor transistor $M_{1B}$ and the mirrored (second) transistor $M_{1A}$, is configured to control a drain current of the mirrored (second) second transistor $M_{1A}$ with respect to the bias current. The feedback block 810 may either be implemented with a variable current source or other circuit configured to control a drain current of the second transistor with respect to the bias current.

Figure 9:
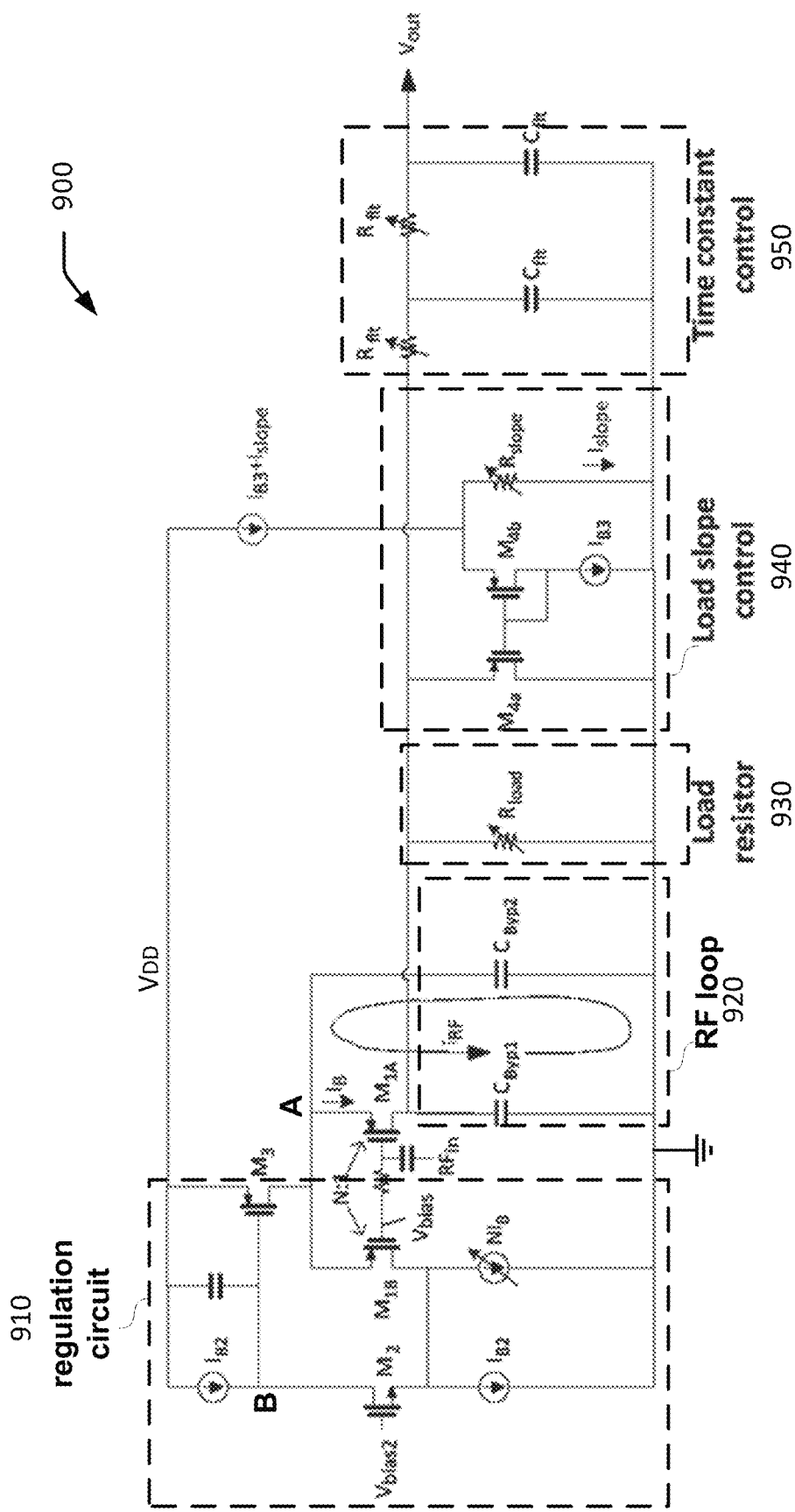
FIG. 9 is a diagram illustrating a disclosed RF power sensor that employs a PMOS transistor for the power sensor transistor, in accordance with examples described herein.

FIG. 9 is a diagram illustrating an example of a RF power sensor 900 that employs a PMOS transistor for the power sensor transistor $M_{1A}$, in accordance with examples described herein. The RF power sensor 900 provides power supply rejection, high sensitivity, and a wide dynamic range. A PMOS transistor, which allows for lower 1/f noise, is employed for the power sensor transistor $M_{1A}$.

During operation, an RF input signal is input into the RF input $RF_{in}$ of the power sensor 900. The RF input signal flows into the power sensor transistor $M_{1A}$ via an input capacitor. The input capacitor is coupled to the power sensor transistor $M_{1A}$. Node A in the power sensor 900 may function as an AC ground. In power sensor 900, the source of the power sensing transistor $M_{1A}$, which is a PMOS transistor, is coupled to a higher voltage than ground. An AC ground (e.g., some reference potential corresponding to a ground in the circuit) is established at Node A by the regulation circuit 910. It should be noted that the current in the mirrored transistor $M_{1B}$ does not have to be larger than the current in the power sensor transistor $M_{1A}$, but is it advantageous from a noise perspective to do so. A gate of the mirrored transistor $M_{1B}$ and a gate of the power sensor transistor $M_{1A}$ are coupled to each other via a bias resistor. A bias voltage $V_{bias}$ is coupled and applied to the gate of the mirrored transistor $M_{1B}$. The power sensor transistor $M_{1A}$ branch operates at a low current to make M1A operation very nonlinear, for power detection performance. Compared to the power sensor transistor $M_{1A}$, the Node A becomes a low impedance node.

For example, when an RF current is input into the power sensor 900, the current in power sensor transistor $M_{1A}$ changes, resulting in a change in the current $I_B$, which further causes a change in the current flow through mirrored transistor $M_{1B}$. The current in the mirrored transistor $M_{1B}$ then no longer matches the current in current source $NI_B$, which leads to a change in the current in transistor $M_2$, which then causes a voltage change in Node B. The voltage change in Node B causes a change in the current in transistor $M_3$. As such, any currents that are within the loop bandwidth of this loop (e.g., the loop formed from the mirrored transistor $M_{1B}$ to transistor $M_2$ to transistor $M_3$) are compensated by transistor $M_3$. A change in the $I_B$ current flows through the loop (e.g., the loop formed from the mirrored transistor $M_{1B}$ to transistor $M_2$ to transistor $M_3$), and causes a change the current in transistor $M_3$. The transistor $M_3$ compensates for the change in the current such that the current in the mirrored transistor $M_{1B}$ again matches the current of the current source $NI_B$. The low frequency currents (e.g., the detected currents) pass through transistor $M_3$.

The high (e.g., harmonic) frequency currents pass through bypass capacitor $C_{Byp2}$ and bypass capacitor $C_{Byp1}$. These two bypass capacitors $C_{Byp1}$ and $C_{Byp2}$ along with the power sensor transistor $M_{1A}$ form the RF loop 920 of the power sensor 900. Capacitor $C_{Byp2}$ is coupled to a source of the power sensor transistor $M_{1A}$, and capacitor $C_{Byp1}$ is coupled to a drain of the power sensor transistor $M_{1A}$. Capacitors $C_{Byp1}$ and $C_{Byp2}$ are both coupled to ground (or some reference potential). It should be noted that this ground is the reference ground for the RF signal and can be a separate connection from other ground connections within the circuit.

The high frequency currents will continuously rotate within a current loop $I_{RF}$ in the RF loop 920. As such, the RF loop 920 contains the high frequency currents, and prevents the high frequency currents from flowing to the power supply $V_{DD}$ or to a low reference voltage (e.g., a ground), thereby preventing contamination of the power supply $V_{DD}$ or ground.

During operation, the power sensor transistor $M_{1A}$ produces a current that indicates the power level of the RF input signal, and that current flows across a load resistor $R_{load}$ 930 (e.g., a load). The power sensor transistor $M_{1A}$ is coupled to the load resistor $R_{load}$ 930, which is coupled to ground or some reference potential. A large value (e.g., 5 to 10 k Ohms) for the load resistor $R_{load}$ 930 can provide for improved sensitivity at lower RF input signal power levels. It should be noted that, in one or more examples, a load circuit may be employed for the load resistor $R_{load}$ 930, such as a transimpedance amplifier or a current mirror.

However, at high RF input signal power levels, a large voltage will be present across the load resistor $R_{load}$ 930, and this large voltage can cause the power sensor transistor $M_{1A}$ to operate in the triode region, which causes the RF power sensor 900 to saturate. As such, an optional load slope control 940 can be employed to extend the dynamic range of the power sensor 900. The load slope control 940 circuit is coupled in parallel with the load resistor $R_{load}$ 930. The load slope control 950 circuit comprises a first load slope control transistor $M_{4b}$ and a second load slope control transistor $M_{4a}$, where a gate of the first load slope control transistor $M_{4b}$ is coupled to a gate of the second load slope control transistor $M_{4a}$. The load slope control 950 circuit further comprises a slope resistor $R_{slope}$ (e.g. a variable resistor) coupled to a source of the first load slope control transistor $M_{4b}$. Further, the load slope control 950 circuit comprises a slope current source $I_{B3}$ coupled to a drain of the first load slope control transistor $M_{4b}$, a gate of the first load slope control transistor $M_{4b}$, and a gate of the second load slope control transistor $M_{4a}$.

With the load slope control 940, when the voltage across the load resistor $R_{load}$ 930 gets above a certain threshold voltage level, the transistor $M_{4a}$ of the load slope control 940 starts turning "on", which produces a dynamic resistance. The dynamic resistance is similar to putting an equivalent resistance in parallel with the load resistor $R_{load}$ 930 resistance. As such, at higher RF input signal power levels, the overall load resistance, which is the parallel combination of the resistances in the load resistor $R_{load}$ 930 and the load slope control 940, becomes smaller. With the overall load resistance becoming smaller, as the current (or power level) is increased, the voltage will climb more slowly, which allows for a larger dynamic range. It should be noted that, a resistor (not shown) may optionally be added from the drain of transistor $M_{4A}$ and ground. This added resistor can allow for a more well-controlled slope which, once transistor $M_{4A}$ is fully on, would then be determined by the parallel combination of the added resistor and the load resistor $R_{load}$ 930. It should be noted that, in one or more examples, a resistor may be added between the source of transistor $M_{4A}$ and the output voltage Vout. In this case, the parallel combination of that added resistor and Rload can be obtained.

The power sensor 900 also comprises an optional time constant control 950. In the example power sensor 900 of FIG. 5, the time constant control 950 is formed from two time constant capacitors $C_{flt}$ and two variable time constant resistors $R_{flt}$. The time constant control 950 operates as an output filter for the power sensor 900. In other implementations, other such implementations of the time constant control 950 can be used. It should be noted that, in one or more embodiments, the time constant control 950 can be implemented with a single resistor capacitor (RC) circuit (e.g., a circuit comprising one time constant capacitor $C_{flt}$ and one time constant resistor $R_{flt}$ (e.g., a variable resistor)).

Figure 10:
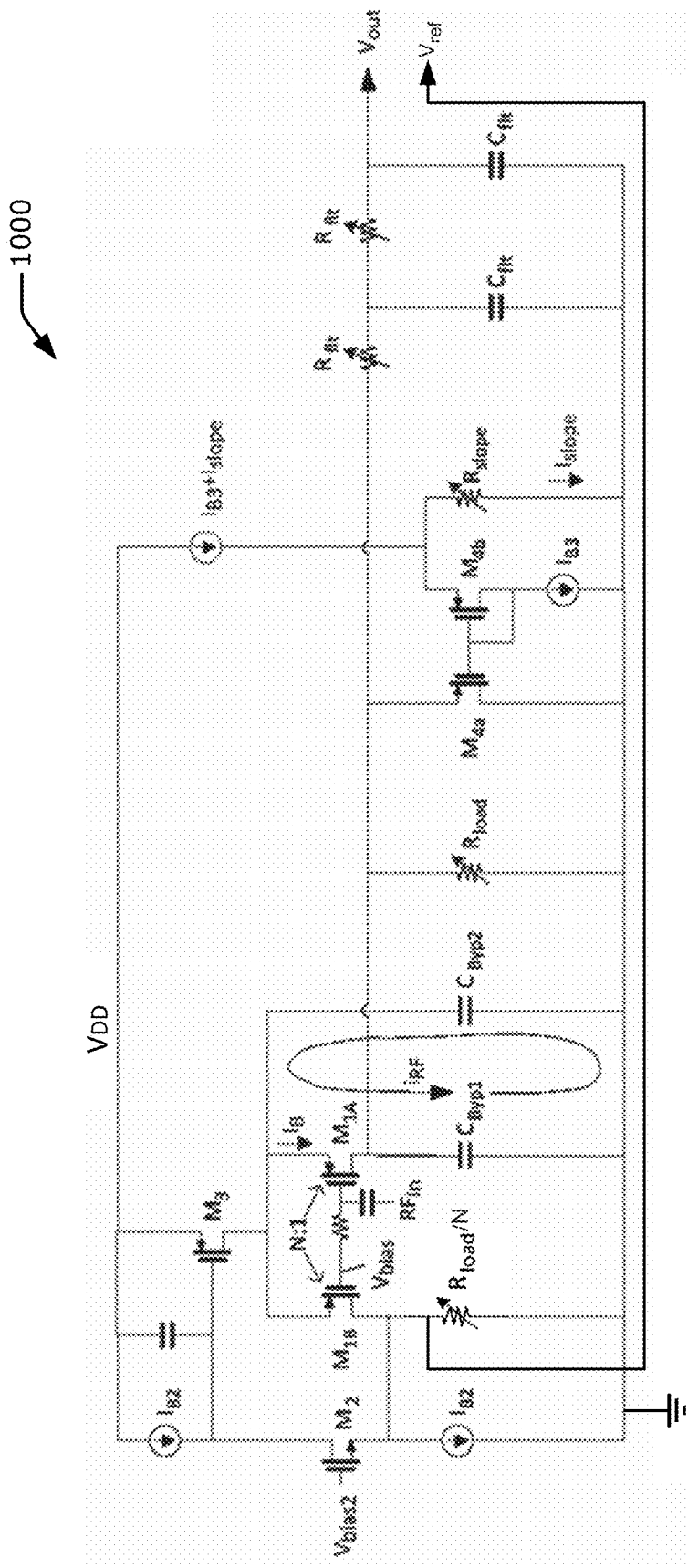
FIG. 10 is a diagram illustrating a disclosed RF power sensor that employs a PMOS transistor for the power sensor transistor and generates a reference voltage, in accordance with examples described herein.

FIG. 10 is a diagram illustrating a disclosed RF power sensor 1000 that employs a PMOS transistor for the power sensor transistor $M_{1A}$ and generates a reference voltage $V_{ref}$, in accordance with examples described herein. For certain power sensor topologies (e.g., where an analog-to-digital converter is used for digitizing the output), it is advantageous to generate a reference voltage $V_{ref}$ that corresponds to no RF input signal power (e.g., where the output voltage $V_{out}$ minus the reference voltage $V_{ref}$ is equal to zero (0), when no RF input signal power is applied). During operation, the output voltage $V_{out}$ minus the reference voltage $V_{ref}$ quantity is digitized.

The RF power sensor 1000 design in FIG. 10 is similar to the RF power sensor 900 design of FIG. 9, except that the current source $NI_B$ in the RF power sensor 900 is replaced with a load resister $R_{load}/N$ for the RF power sensor 1000 design of FIG. 10. In the topology of the RF power sensor 1000 of FIG. 10, a scaled replica of the load resistor $R_{load}/N$ is used in lieu of the bias current source $NI_B$ of the RF sensor 900 of FIG. 9. The control circuit (e.g., refer to the regulation circuit 910 of FIG. 9) of RF power sensor 1000 establishes a constant voltage $V_{ref}$ across the load resistor, which then in turn causes a constant current to flow in the load resistor $R_{load}/N$, thus establishing (providing) a constant bias current in the mirrored transistor $M_{1B}$. As such, the combination of the control circuit along with the load resistor $R_{load}/N$ together can be construed as implementing a current source.

For the RF power sensor 1000, the reference voltage $V_{ref}$ is taken from above the added load resistor $R_{load}/N$. The RF power sensor 1000 has the advantage of making the bias noise common-mode and, therefore, the bias noise cancels out at the output of RF power sensor 1000.

Figure 11:
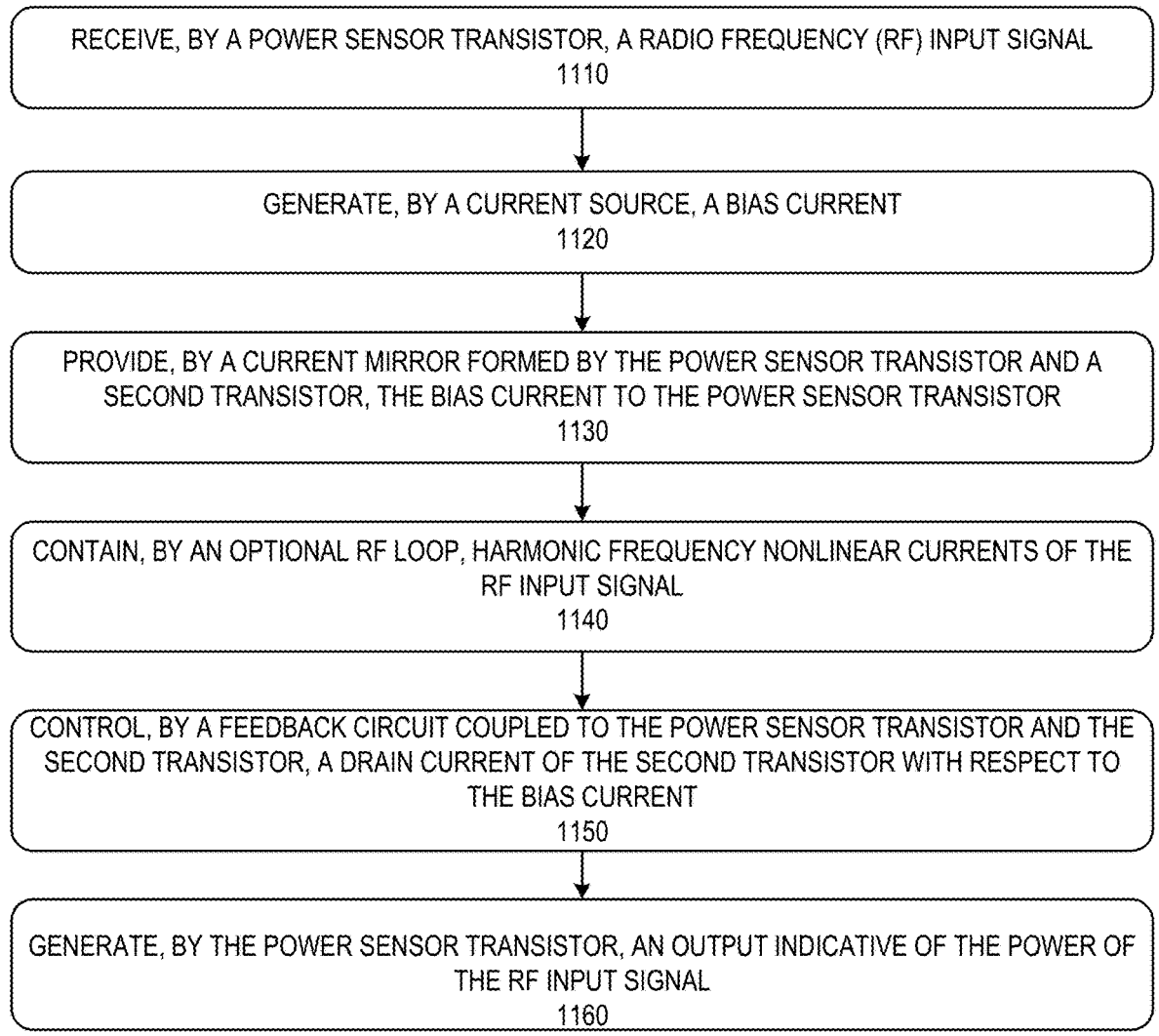
FIG. 11 is a flow chart showing an example of a method of operation of an RF power sensor, in accordance with examples described herein.

FIG. 11 is a flow chart showing an example of a method 1100 of operation of an RF power sensor, in accordance with examples described herein. At the start of the method 1100, a power sensor transistor (e.g., power sensor transistor $M_{1B}$ of FIG. 8A or power sensor transistor $M_{2B}$ of FIG. 7A) receives an RF input signal at block 1110. A current source (e.g., bias current source 840 of FIG. 8A or bias current source 740 of FIG. 7A) generates a bias current (e.g., bias current $I_{bias}$ of FIGS. 8A and 7A) at block 1120. A current mirror, formed by the power sensor transistor and a second transistor (e.g., mirrored transistor $M_{1A}$ of FIG. 8A or mirrored transistor $M_{2A}$ of FIG. 7A), provides the bias current to the power sensor transistor at block 1130.

An optional RF loop (e.g., current loop $I_{RF}$ in FIGS. 8A and 7A) contains (within the RF loop) harmonic frequency nonlinear currents of the RF input signal at block 1140. At block 1150, a feedback circuit (e.g., feedback block 810 of FIG. 8A or feedback block 721 of FIG. 7A), coupled to the power sensor transistor and the second transistor, controls a drain current of the second transistor with respect to the bias current. At block 1160, the power sensor transistor generates an output indicative of the power of the RF input signal. Then, the method 1100 ends.

Figure 12:
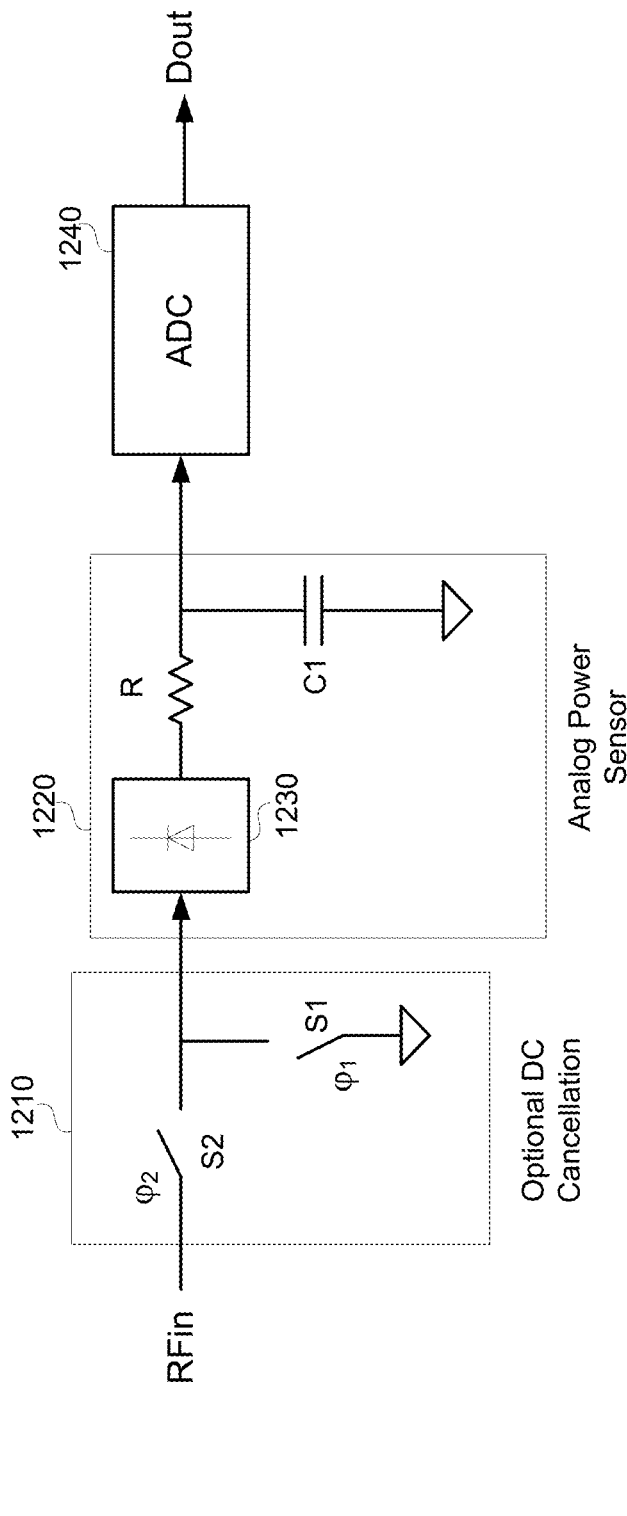
FIG. 12 is a diagram illustrating an exemplary power sensing circuit that can include an implementation of an RF power sensor, in accordance with examples described herein.

FIG. 12 is a diagram illustrating an exemplary power sensing circuit 1200 that can include an implementation of an RF power sensor (e.g., RF power sensor 700, 701, 800, 801, and 900 of FIGS. 7A, 7B, 8A, 8B, and 9, respectively), in accordance with examples described herein. The power sensing circuit 1200 comprises an optional DC cancellation circuit 1210, an analog power sensor 1220, and an analog-to-digital converter 1240. The DC cancelation circuit 1210 comprises two switches S1 and S2. The analog power sensor 1220 comprises an RF power sensor 1230 coupled to a resistor R, which is coupled to ground via a capacitor C1. Any of the disclosed RF power sensors 700, 701, 800, 801, and 900 of FIGS. 7A, 7B, 8A, 8B, and 9, respectively, may be employed for the RF power sensor 1230 of the power sensing circuit 1200.

During operation of the power sensing circuit 1200, an RF input signal $RF_{in}$ is input into the power sensing circuit 1200. The DC cancellation circuit 1210 eliminates the DC offset by obtaining a measurement with no input signal ($\varphi 1$), and subtracting that result from a result with the RF input signal present ($\varphi 2$). The analog power sensor 1220 converts the RF input signal to a lower-frequency output signal that represents a filtered version of the envelope of the RF input signal. The analog-to-digital converter 1240 converts the analog lower-frequency output signal to a digital output signal $D_{out}$, which is then outputted from the power sensing circuit 1200.

Figure 13:
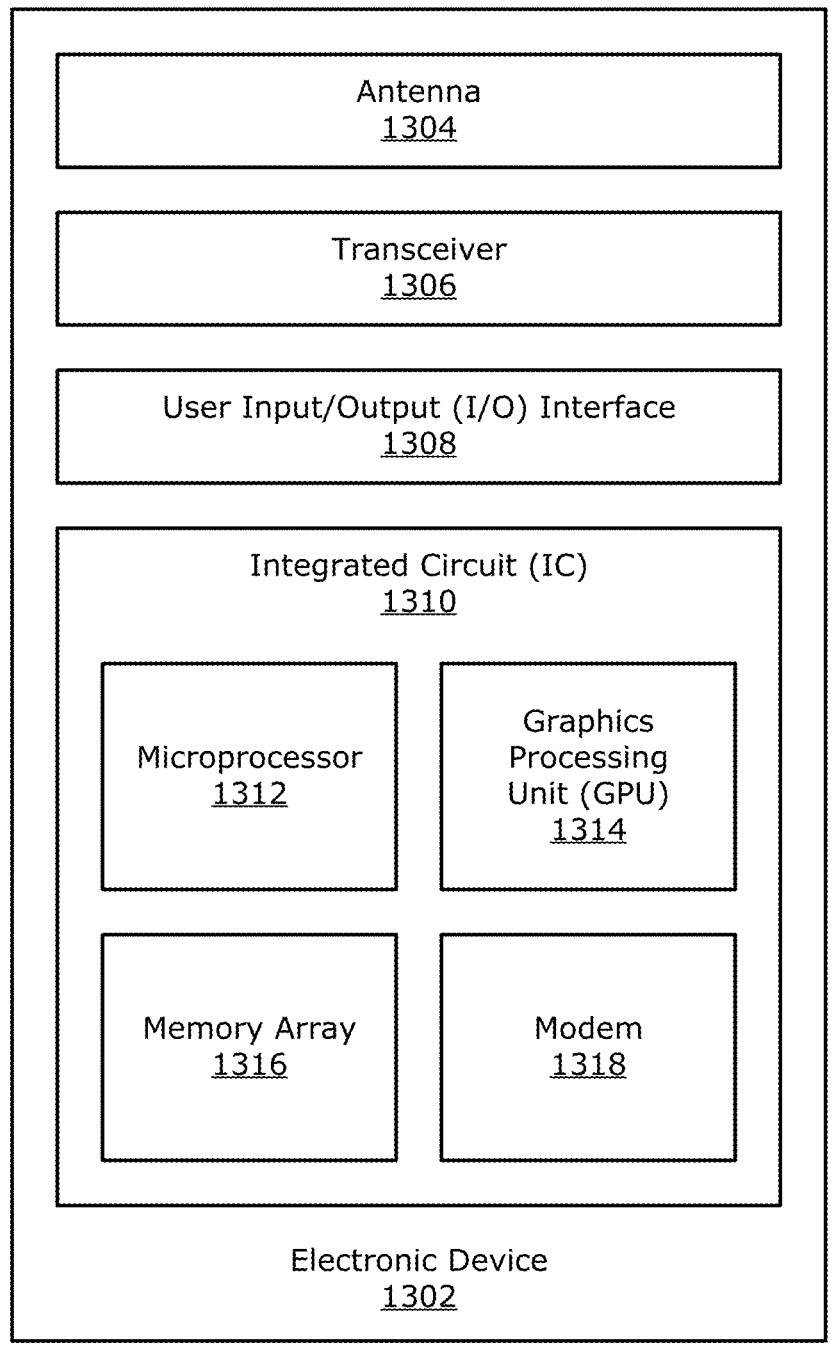
FIG. 13 is a diagram illustrating an exemplary electronic device, which includes a transceiver that can implement an RF power sensor, in accordance with examples described herein.

FIG. 13 is a diagram illustrating an exemplary electronic device 1302, which includes a transceiver 1306 that can include and/or implement an RF power sensor, in accordance with examples described herein. As shown, the electronic device 1302 includes an antenna 1304, a transceiver 1306, and a user input/output (I/O) interface 1308, in addition to the integrated circuit 1310. Illustrated examples of the integrated circuit 1310, or cores thereof, include a microprocessor 1312, a graphics processing unit (GPU) 1314, a memory array 1316, and a modem 1318. Each component can be operably coupled to another component, such as the GPU 1314 being operably coupled to the user I/O interface 1308.

The electronic device 1302 can be a mobile or battery-powered device or a fixed device that is designed to be powered by an electrical grid. Examples of the electronic device 1302 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1302 can also be a device, or a portion thereof, having embedded electronics. Examples of the electronic device 1302 with embedded electronics include a passenger vehicle, industrial equipment, a refrigerator or other home appliance, a drone or other unmanned aerial vehicle (UAV), or a power tool.

For an electronic device with a wireless capability, the electronic device 1302 includes an antenna 1304 that is coupled to a transceiver 1306 to enable reception or transmission of one or more wireless signals. The integrated circuit 1310 may be coupled to the transceiver 1306 to enable the integrated circuit 1310 to have access to received wireless signals or to provide wireless signals for transmission via the antenna 1304. The electronic device 1302 as shown also includes at least one user I/O interface 1308. Examples of the user I/O interface 1308 include a keyboard, a mouse, a microphone, a touch-sensitive screen, a camera, an accelerometer, a haptic mechanism, a speaker, a display screen, or a projector. The transceiver 1306 can correspond to, for example, the wireless transceiver 122 (e.g., of FIG. 1), and can include an RF power sensor, in accordance with examples described herein.

The integrated circuit 1310 may comprise, for example, one or more instances of a microprocessor 1312, a GPU 1314, a memory array 1316, a modem 1318, and so forth. The microprocessor 1312 may function as a central processing unit (CPU) or other general-purpose processor. Some microprocessors include different parts, such as multiple processing cores, that may be individually powered on or off. The GPU 1314 may be especially adapted to process visual related data for display, such as video data images. If visual-related data is not being rendered or otherwise processed, the GPU 1314 may be fully or partially powered down. The memory array 1316 stores data for the microprocessor 1312 or the GPU 1314. Example types of memory for the memory array 1316 include random access memory (RAM), such as dynamic RAM (DRAM) or static RAM (SRAM); flash memory; and so forth. If programs are not accessing data stored in memory, the memory array 1316 may be powered down overall or block-by-block. The modem 1318 demodulates a signal to extract encoded information or modulates a signal to encode information into the signal. If there is no information to decode from an inbound communication or to encode for an outbound communication, the modem 1318 may be idled to reduce power consumption. The integrated circuit 1310 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1310 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1310 generally, may be termed cores or circuit blocks. Examples of cores or circuit blocks include, in addition to those that are illustrated in FIG. 13, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Illustrative Aspects of the Disclosure Include:

Aspect 1: A power sensor, the power sensor comprising: a power sensor transistor configured to receive a radio frequency (RF) input signal and to generate an output indicative of a power of the RF input signal; a current source configured to generate a bias current; a current mirror, which is formed by the power sensor transistor and a second transistor, configured to provide the bias current to the power sensor transistor; and a feedback circuit, which is coupled to the power sensor transistor and the second transistor, configured to control a drain current of the second transistor with respect to the bias current.

Aspect 2: The power sensor of Aspect 1, wherein the power sensor transistor and the second transistor are both p-channel metal-oxide semiconductor (PMOS) transistors.

Aspect 3: The power sensor of any of Aspects 1 or 2, wherein the power sensor transistor and the second transistor are both n-channel metal-oxide semiconductor (NMOS) transistors.

Aspect 4: The power sensor of any of Aspects 1 to 3, wherein the feedback circuit is further configured to control the drain current of the second transistor such that the drain current is equal to the bias current.

Aspect 5: The power sensor of any of Aspects 1 to 4, wherein the feedback circuit comprises a variable current source configured to generate a control current, which controls the drain current of the second transistor.

Aspect 6: The power sensor of Aspect 5, wherein the variable current source is coupled to the power sensor transistor and the second transistor.

Aspect 7: The power sensor of any of Aspects 5 or 6, wherein the feedback circuit further comprises a control circuit configured to control the variable current source.

Aspect 8: The power sensor of Aspect 7, wherein the control circuit is coupled to the variable current source and to the second transistor.

Aspect 9: The power sensor of any of Aspects 1 to 8, wherein the second transistor is coupled to the current source.

Aspect 10: The power sensor of any of Aspects 1 to 9, wherein a gate of the second transistor and a gate of the power sensor transistor are coupled to each other via a bias resistor.

Aspect 11: The power sensor of any of Aspects 1 to 10, wherein a bias voltage is applied to a gate of the second transistor.

Aspect 12: The power sensor of any of Aspects 1 to 11, wherein an input capacitor is coupled to a gate of the power sensor transistor.

Aspect 13: The power sensor of any of Aspects 1 to 12, wherein the power sensor transistor is coupled to a load.

Aspect 14: The power sensor of Aspect 13, wherein the load is coupled to a reference voltage, when the power sensor transistor and the second transistor are both NMOS transistors.

Aspect 15: The power sensor of Aspect 13, wherein the load is coupled to ground, when the power sensor transistor and the second transistor are both PMOS transistors.

Aspect 16: The power sensor of Aspect 13 to 15, wherein the power sensor further comprises a load slope control circuit coupled in parallel with the load, the load slope control circuit configured to extend a dynamic range of the power sensor by producing a dynamic resistance when a voltage across the load is above a threshold voltage.

Aspect 17: The power sensor of Aspect 16, wherein the load slope control circuit comprises a first load slope control transistor and a second load slope control transistor, wherein a gate of the first load slope control transistor is coupled to a gate of the second load slope control transistor.

Aspect 18: The power sensor of Aspect 17, wherein the load slope control circuit further comprises a slope resistor coupled to a source of the first load slope control transistor.

Aspect 19: The power sensor of Aspect 17, wherein the load slope control circuit further comprises a slope current source coupled to a drain of the first load slope control transistor, a gate of the first load slope control transistor, and a gate of the second load slope control transistor.

Aspect 20: The power sensor of any of Aspects 1 to 19, wherein the power sensor further comprises an RF loop configured to contain, within the RF loop, harmonic frequency nonlinear currents of the RF input signal.

Aspect 21: The power sensor of Aspect 20, wherein the RF loop comprises the power sensor transistor and two capacitors, and wherein a first of the two capacitors is coupled to a source of the power sensor transistor, a second of the two capacitors is coupled to a drain of the power sensor transistor, and both of the two capacitors are coupled to ground.

Aspect 22: The power sensor of any of Aspects 1 to 21, wherein the power sensor further comprises a time constant control circuit, which is coupled to the power sensor transistor, configured to operate as an output filter for the power sensor.

Aspect 23: The power sensor of Aspect 22, wherein the time constant control circuit comprises at least one time constant capacitor and at least one time constant resistor.

Aspect 24: The power sensor of any of Aspects 1 to 23, wherein one of a bias current source or a scaled replica of a load resistor is employed for the current source.

Aspect 25: The power sensor of Aspect 24, wherein when the scaled replica of the load resistor is employed for the current source, a reference voltage is taken from above the scaled replica of the load resistor.

Aspect 26: A power sensor, the power sensor comprising: a power sensor transistor configured to receive a radio frequency (RF) input signal and to generate an output indicative of a power of the RF input signal; a load coupled to the power sensor transistor; a second transistor, wherein a gate of the second transistor and a gate of the power sensor transistor are coupled to each other, and wherein a source of the power sensor transistor is coupled to a source of the second transistor; and a feedback circuit coupled to the source of the power sensor transistor and the source of the second transistor, wherein the feedback circuit is configured to control a drain current of the second transistor with respect to a bias current.

Aspect 27: The power sensor of Aspect 26, wherein the feedback circuit comprises a control circuit and a variable current source, wherein the control circuit is coupled to a drain of the second transistor and the variable current source, and wherein the variable current source is coupled to the source of the power sensor transistor and the source of the second transistor.

Aspect 28: The power sensor of any of Aspects 26 or 27, wherein the power sensor further comprises: a first capacitor coupled between the source of the power sensor transistor and ground; and a second capacitor coupled between a drain of the power sensor transistor and the ground.

Aspect 29: The power sensor of any of Aspects 26 to 28, wherein the power sensor further comprises a current source coupled to a drain of the second transistor, wherein the current source is configured to generate the bias current.

Aspect 30: A method for sensing power, the method comprising: receiving, by a power sensor transistor, a radio frequency (RF) input signal; generating, by a current source, a bias current; providing, by a current mirror formed by the power sensor transistor and a second transistor, the bias current to the power sensor transistor; controlling, by a feedback circuit coupled to the power sensor transistor and the second transistor, a drain current of the second transistor with respect to the bias current; and generating, by the power sensor transistor, an output indicative of the RF input signal.

Aspect 31: A method including operations according to any of Aspects 1 to 29.

What is claimed is:

1. A power sensor, the power sensor comprising:
a power sensor transistor configured to receive a radio frequency (RF) input signal and to generate an output indicative of a power of the RF input signal;
a current source configured to generate a bias current;
a current mirror, which is formed by the power sensor transistor and a second transistor, configured to provide the bias current to the power sensor transistor; and
a feedback circuit, which is coupled to the power sensor transistor and the second transistor, configured to control a drain current of the second transistor with respect to the bias current.

2. The power sensor of claim 1, wherein the power sensor transistor and the second transistor are both p-channel metal-oxide semiconductor (PMOS) transistors.

3. The power sensor of claim 1, wherein the power sensor transistor and the second transistor are both n-channel metal-oxide semiconductor (NMOS) transistors.

4. The power sensor of claim 1, wherein the feedback circuit is further configured to control the drain current of the second transistor such that the drain current is equal to the bias current.

5. The power sensor of claim 1, wherein the feedback circuit comprises a variable current source configured to generate a control current, which controls the drain current of the second transistor.

6. The power sensor of claim 5, wherein the variable current source is coupled to the power sensor transistor and the second transistor.

7. The power sensor of claim 5, wherein the feedback circuit further comprises a control circuit configured to control the variable current source.

8. The power sensor of claim 7, wherein the control circuit is coupled to the variable current source and to the second transistor.

9. The power sensor of claim 1, wherein the second transistor is coupled to the current source.

10. The power sensor of claim 1, wherein a gate of the second transistor and a gate of the power sensor transistor are coupled to each other via a bias resistor.

11. The power sensor of claim 1, wherein a bias voltage is applied to a gate of the second transistor.

12. The power sensor of claim 1, wherein an input capacitor is coupled to a gate of the power sensor transistor.

13. The power sensor of claim 1, wherein the power sensor transistor is coupled to a load.

14. The power sensor of claim 13, wherein the load is coupled to a reference voltage, when the power sensor transistor and the second transistor are both NMOS transistors.

15. The power sensor of claim 13, wherein the load is coupled to ground, when the power sensor transistor and the second transistor are both PMOS transistors.

16. The power sensor of claim 13, wherein the power sensor further comprises a load slope control circuit coupled in parallel with the load, the load slope control circuit configured to extend a dynamic range of the power sensor by producing a dynamic resistance when a voltage across the load is above a threshold voltage.

17. The power sensor of claim 16, wherein the load slope control circuit comprises a first load slope control transistor and a second load slope control transistor, wherein a gate of the first load slope control transistor is coupled to a gate of the second load slope control transistor.

18. The power sensor of claim 17, wherein the load slope control circuit further comprises a slope resistor coupled to a source of the first load slope control transistor.

19. The power sensor of claim 17, wherein the load slope control circuit further comprises a slope current source coupled to a drain of the first load slope control transistor, a gate of the first load slope control transistor, and a gate of the second load slope control transistor.

20. The power sensor of claim 1, wherein the power sensor further comprises an RF loop configured to contain, within the RF loop, harmonic frequency nonlinear currents of the RF input signal.

21. The power sensor of claim 20, wherein the RF loop comprises the power sensor transistor and two capacitors, and
wherein a first of the two capacitors is coupled to a source of the power sensor transistor, a second of the two capacitors is coupled to a drain of the power sensor transistor, and both of the two capacitors are coupled to ground.

22. The power sensor of claim 1, wherein the power sensor further comprises a time constant control circuit, which is coupled to the power sensor transistor, configured to operate as an output filter for the power sensor.

23. The power sensor of claim 22, wherein the time constant control circuit comprises at least one time constant capacitor and at least one time constant resistor.

24. The power sensor of claim 1, wherein one of a bias current source or a scaled replica of a load resistor is employed for the current source.

25. The power sensor of claim 24, wherein when the scaled replica of the load resistor is employed for the current source, a reference voltage is taken from above the scaled replica of the load resistor.

26. A power sensor, the power sensor comprising: a power sensor transistor configured to receive a radio frequency (RF) input signal and to generate an output indicative of a power of the RF input signal; a load coupled to the power sensor transistor; a second transistor, wherein a gate of the second transistor and a gate of the power sensor transistor are directly coupled to each other, and wherein a source of the power sensor transistor is directly coupled to a source of the second transistor; and a feedback circuit coupled to the source of the power sensor transistor and the source of the second transistor, wherein the feedback circuit is configured to control a drain current of the second transistor with respect to a bias current.

27. The power sensor of claim 26, wherein the feedback circuit comprises a control circuit and a variable current source,
wherein the control circuit is coupled to a drain of the second transistor and the variable current source, and
wherein the variable current source is coupled to the source of the power sensor transistor and the source of the second transistor.

28. The power sensor of claim 26, wherein the power sensor further comprises:
a first capacitor coupled between the source of the power sensor transistor and ground; and
a second capacitor coupled between a drain of the power sensor transistor and the ground.

29. The power sensor of claim 26, wherein the power sensor further comprises a current source coupled to a drain of the second transistor, wherein the current source is configured to generate the bias current.

30. A method for sensing power, the method comprising:
receiving, by a power sensor transistor, a radio frequency (RF) input signal;
generating, by a current source, a bias current;
providing, by a current mirror formed by the power sensor transistor and a second transistor, the bias current to the power sensor transistor;
controlling, by a feedback circuit coupled to the power sensor transistor and the second transistor, a drain current of the second transistor with respect to the bias current; and
generating, by the power sensor transistor, an output indicative of the RF input signal.

* * * * *